(12) United States Patent
Tua

(10) Patent No.: US 10,324,169 B2
(45) Date of Patent: Jun. 18, 2019

(54) DIGITAL COMPENSATION FOR AMPLIFIER-INDUCED INSTABILITY

(71) Applicant: Carlos G. Tua, King George, VA (US)

(72) Inventor: Carlos G. Tua, King George, VA (US)

(73) Assignee: The United States of America as represented by the Secretary of the Navy., Washington, DC (US)

( * ) Notice: Subject to any disclaimer, the term of this patent is extended or adjusted under 35 U.S.C. 154(b) by 574 days.

(21) Appl. No.: 15/091,364

(22) Filed: Apr. 5, 2016

(65) Prior Publication Data

US 2016/0334506 A1 Nov. 17, 2016

Related U.S. Application Data

(60) Provisional application No. 62/143,600, filed on Apr. 6, 2015.

(51) Int. Cl.
*G01S 7/40* (2006.01)
*H03F 1/32* (2006.01)
*G01S 13/02* (2006.01)
*H03F 3/217* (2006.01)

(52) U.S. Cl.
CPC .......... *G01S 7/4008* (2013.01); *H03F 1/3247* (2013.01); *H03F 3/217* (2013.01); *G01S 2013/0272* (2013.01)

(58) Field of Classification Search
CPC .......... G01S 7/4008; G01S 2013/0272; H03F 1/3247; H03F 3/217
USPC ....................................................... 342/169
See application file for complete search history.

(56) References Cited

U.S. PATENT DOCUMENTS

| 4,783,660 | A | * | 11/1988 | Pierce | ....................... | G01S 7/28 |
| | | | | | | 342/101 |
| 4,931,800 | A | * | 6/1990 | Ward | ..................... | G01S 7/4004 |
| | | | | | | 342/162 |
| 5,124,708 | A | * | 6/1992 | Mackes | ................. | G01S 7/4008 |
| | | | | | | 342/174 |
| 5,440,311 | A | * | 8/1995 | Gallagher | ............. | G01S 13/284 |
| | | | | | | 342/132 |

(Continued)

OTHER PUBLICATIONS

F. Fornetti et al.: "The Application of GaN HEMTs to Pulsed PAs and Radar Transmitters", *Microwave Integrated Circuits Conf 7th European* (2012), 405-408. http://www.ee.usyd.edu.au/people/jim.rathmell/UserFiles/File/06483822.pdf.

(Continued)

*Primary Examiner* — Peter M Bythrow
*Assistant Examiner* — Nuzhat Pervin
(74) *Attorney, Agent, or Firm* — Gerhard W. Thielman, Esq.

(57) ABSTRACT

A method is provided for correcting radar signal transient variation induced by power amplification in a pulse radar transmitter. The method includes establishing a first plurality of characteristics of a first pulse sequence having a digital pulse; establishing a second plurality of characteristics of a second pulse sequence having a plurality of digital pulses; comparing the first and second pluralities of characteristics to determine a sequence difference; providing pre-distortion coefficients for the plurality of digital pulses corresponding to the signal transient variation in response to the sequence difference; and applying the coefficients to the plurality of digital pulses prior to the power amplification.

13 Claims, 25 Drawing Sheets

(56) References Cited

U.S. PATENT DOCUMENTS

| | | | | |
|---|---|---|---|---|
| 6,025,911 | A * | 2/2000 | Diddams | G01J 11/00 356/450 |
| 6,671,334 | B1 * | 12/2003 | Kuntz | H04L 7/0029 348/E17.003 |
| 6,879,281 | B2 * | 4/2005 | Gresham | G01S 7/282 342/134 |
| 7,286,009 | B2 * | 10/2007 | Andersen | H03F 1/32 330/10 |
| 7,728,658 | B2 * | 6/2010 | Andersen | H03F 1/26 330/10 |
| 7,773,028 | B2 * | 8/2010 | Chan | G01S 7/282 342/118 |
| 9,194,939 | B2 * | 11/2015 | Mukai | G01S 7/28 |
| 9,419,658 | B2 * | 8/2016 | Seebacher | H04B 1/0475 |
| 2003/0193430 | A1 * | 10/2003 | Gresham | G01S 7/282 342/70 |
| 2007/0152750 | A1 * | 7/2007 | Andersen | H03F 1/32 330/136 |
| 2008/0136704 | A1 * | 6/2008 | Chan | G01S 7/282 342/201 |
| 2009/0027117 | A1 * | 1/2009 | Andersen | H03F 1/26 330/10 |
| 2010/0019947 | A1 * | 1/2010 | Kruys | G01S 7/021 342/20 |
| 2010/0220770 | A1 * | 9/2010 | Oka | H03F 1/32 375/219 |
| 2010/0222015 | A1 * | 9/2010 | Shimizu | H03F 1/02 455/102 |
| 2010/0271012 | A1 * | 10/2010 | Patterson | G01B 7/004 324/207.15 |
| 2010/0291885 | A1 * | 11/2010 | Shimizu | H03F 1/0222 455/102 |
| 2015/0304068 | A1 * | 10/2015 | Xiong | H04L 25/03159 375/267 |
| 2016/0216367 | A1 * | 7/2016 | Phillips | G01S 7/4008 |

OTHER PUBLICATIONS

C. S. Whelan et al.: "GaN Technology for Radars", CS Mantech Conference (2012) http://gaasmantech.com/Digests/2012/papers/3.2.011.pdf.

D. A. Gajewski et al.: "Reliability of GaN/AlGaN HEMT MMIC Technology . . . ", 26$^{th}$ JEDEC (2011). http://www.cree.com/~/media/Files/Cree/RF/Papers%20and%20Articles/Reliability_of_GaNAlGaN_HEMT_MMIC_Technology_on_100mm_4HSiC.pdf.

P. Aaen et al.: Modeling and Characterization of RF and Microwave Power FETs, Cambridge (2007) 35-38, 61-62.

V. O. Turin et al. "Electrothermal simulation of the self-heating effects in GaN-based FETs", *J. Appl Phys* 100 (2006) http://ndl.ee.ucr.edu/Balandin-JAP-FET-06.pdf.

K. J. Keesman: *System Identification: An Introduction*, Springer , (2011) 47-51.

M. Skolnik: *Radar Handbook 3/e*, McGraw Hill, (2008) 2.65-2.78.

M. Albulet: *RF Power Amplifiers*, Noble, (2001) §2.11, 114-119. http://plrtzglrb.hu/ghz/books/RF%20Power%20Amplifiers.pdf.

* cited by examiner

TABLE 1

| Layer: | Specific Heat J(kgK) | Density kg/m³ | Thermal Conductivity W(mK) |
|---|---|---|---|
| GaN | 490 | 6100 | 124 |
| SiC | 681 | 3100 | 329 |
| AuSn | 150 | 14500 | 150 |
| W90Cu10 | 174 | 15900 | 200 |

TABLE II
Waveform parameters to stimulate multifunction sequences

| 860<br>Parameter: | CPI 1<br>870<br>Waveform of Interest | 880<br>CPI 2<br>Preceding Waveform |
|---|---|---|
| Pulse with (PW): | 10 microseconds | 50 microseconds |
| Duty Cycle (DC): | 8 % | 2 % |
| Pulse Repetition Frequency (PRF): | 8 kHz | 400 Hz: |
| Coherent Processing Interval (CPI): | 4 milliseconds<br>32 pulses | 20 milliseconds<br>8 pulses |

DIGITAL COMPENSATION FOR AMPLIFIER-INDUCED INSTABILITY

CROSS REFERENCE TO RELATED APPLICATION

Pursuant to 35 U.S.C. § 119, the benefit of priority from provisional application 62/143,600, with a filing date of Apr. 6, 2015, is claimed for this non-provisional application.

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to correction of interpulse instability caused by radar amplifiers excited with dissimilar waveforms. In particular, the invention relates to characterizing the amplifier's transient behavior by cross-correlating a reference signal to an amplified signal, and a digital pre-distortion technique applied to the synthesized signal prior to amplification for correcting a transient input signal from the radar.

Modern radar systems are multifunction in design, supporting a diverse set of missions, each requiring a specialized set of waveforms. For modern multifunction radars, typical operating conditions include transmission of multiple diverse radar waveforms in close succession. Multifunction operation requires the use of several waveforms where duty cycle or pulse width varies from a previous waveform. Radar system engineers design waveforms with specific pulse width, duty cycle, and other requirements for optimal performance for each radar function. These waveforms are stored in a waveform library.

Multifunction capabilities emerge from radar's ability to rapidly change waveforms and arbitrarily steer the antenna beam. This means that at any given time, the radar can change waveform and search angle to perform a different function. The multifunction capabilities can cover a wide selection of functions such as air traffic control, volume surveillance, and dedicated tracking among others; all of these functions can potentially be executed simultaneously. The digital array radar (DAR) architecture, used in current and projected future radar system designs, offers the potential for increased dynamic range when compared to more conventional systems due to the use of a distributed receiver/exciter architecture. This enables higher clutter cancellation ratios, improves Moving Target Indication (MTI) and Pulse Doppler processing. Many processes taking place in a DAR depend on maintaining phase stability over a Coherent Processing Interval (CPI), and over extended periods of time (hours). Phase stability is necessary to achieve a high clutter cancellation ratio, which enhances the target detection capability in a cluttered environment.

Recent radar designs incorporate gallium nitride (GaN) monolithic microwave integrated circuit (MMIC) power amplifier (PA) technology into their final amplification stage. This is due to a high-power density that exceeds 4 W/mm, high efficiency, and high breakdown voltage. GaN PAs represent the state-of-the-art in terms of power density and efficiency, making them appropriate for radar applications. Thus, their properties at a system level need to be understood. Testing of solid state GaN PAs shows that, under multifunction conditions, the assumption of pulse-to-pulse stability lacks validity. These results are available from C. G. Tua: "Analysis of High Power RF Amplifier Electro-Thermal Memory Effects on Radar Performance", 2012(a) and C. G. Tua: "Measurement technique to assess the effect of RF power amplifier memory effects on radar performance", 2012(b). During multifunction operation the radar's power amplifier goes through thermal and electrical transients. These thermal and electrical transients are caused by electrical and electrothermal memory effects, and affect the complex gain of the power amplifier, creating instabilities that manifest as amplitude and phase transient at the amplifier's output signal. The transmitted waveforms are distorted, defeating the premise of identical pulse-to-pulse characteristic in a radar's coherent processing interval (CPI), also known as dwell time. Other potential instabilities have been reported, such as different pulse power due to staggered pulse repetition frequency (PRF), and long-time (hundreds of seconds) amplitude and phase drift due to device temperature changes.

Amplitude and phase (complex gain) transients have been observed to occur over time scales of several milliseconds on a CPI where the duty cycle or pulse width varies from the previous CPI. The time varying complex gain affects the effectiveness of stationary clutter rejection in Pulse Doppler radars, which presents a significant problem. For example, processing for moving target indication (MTI) is highly sensitive to instability in the system. Characterizing these amplitude and phase transients requires a set of sophisticated equipment capable of exciting a PA with multifunction radar waveforms and collecting data for processing. An instrumentation radar and test fixture in Tua, 2012(a), hereafter referred to as the PA Test Fixture, is used to study the observed transients.

To mitigate the amplitude and phase transients, conventional radars add pulses to the typical fill pulses, thereby attenuating the transients. These extra pulses are discarded before processing. This ensures the interpulse instability does not affect the radar's sensitivity. However, adding these pulses cost radar resources. RF energy is wasted reducing the overall efficiency of the system. Such time expended can't be employed to search or track legitimate targets. With the use of more dynamic multifunction waveforms, this fill pulse technique strains the scheduler with more radar required to mitigate the transients. There is no technique to properly mitigate the interpulse instability while minimizing the number of extra pulses needed to do so.

SUMMARY

Conventional radar instability correction techniques yield disadvantages addressed by various exemplary embodiments of the present invention. In particular, exemplary embodiments provide a method for correcting radar signal transient variation induced by power amplification in a pulse radar transmitter. The method includes establishing a first plurality of characteristics of a first pulse sequence having a digital pulse; establishing a second plurality of characteristics of a second pulse sequence having a plurality of digital pulses; comparing the first and second pluralities of characteristics to determine a sequence difference; providing pre-distortion coefficients for the plurality of digital pulses corresponding to the signal transient variation in response to the sequence difference; and applying the coefficients to the plurality of digital pulses prior to the power amplification.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which.

DETAILED DESCRIPTION

Figure 1:
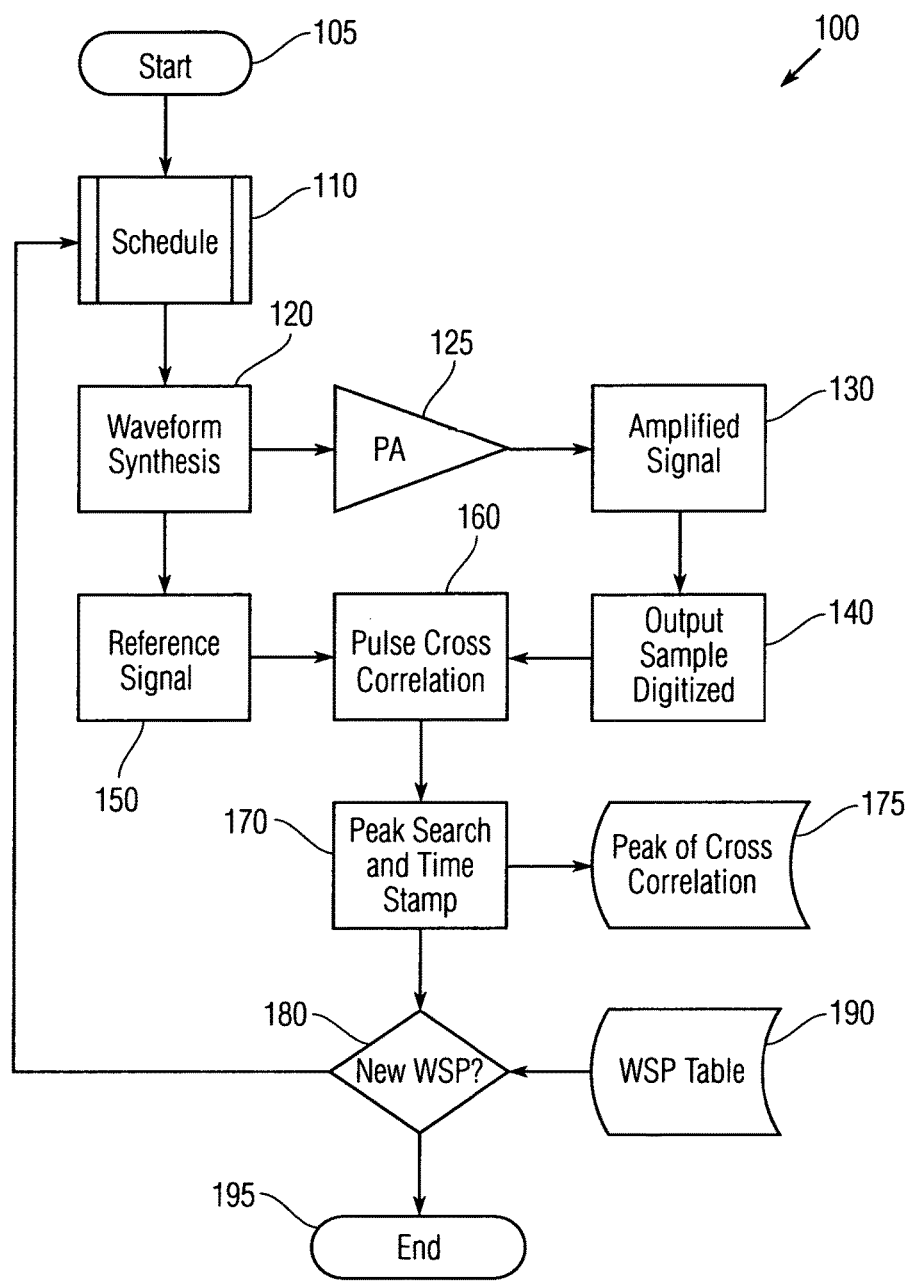
FIG. 1 is a block diagram view of a process for power amplification characterization.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

In accordance with a presently preferred embodiment of the present invention, the components, process steps, and/or data structures may be implemented using various types of operating systems, computing platforms, computer programs, and/or general purpose machines. In addition, those of ordinary skill in the art will readily recognize that devices of a less general purpose nature, such as hardwired devices, or the like, may also be used without departing from the scope and spirit of the inventive concepts disclosed herewith. General purpose machines include devices that execute instruction code. A hardwired device may constitute an application specific integrated circuit (ASIC), digital signal processor (DSP), a field programmable gate array (FPGA) or other related component.

The disclosure generally employs metric units with the following abbreviations: length in centimeters (cm) or meters (m), mass in grams (g) or kilograms (kg), time in seconds (s), angles in degrees (°) or radians (rad), temperature in Kelvin (K) or degrees Celsius (° C.), voltage in volts (V), current in amperes (A), resistance in ohms (Ω), power in watts (W) and signals in decibels (dB). Supplemental measures can be expressed derived from these, such as density in grams-per-cubic-centimeters (g/cm$^3$), moment of inertia in gram-square-centimeters (kg-m$^2$) and the like.

Definitions are provided for the following abbreviations:
accelerated life testing ALT
amplitude modulation AM
arbitrary waveform generator AWG
coherent processing interval CPI
device under test (amplifier) DUT
digital array radar DAR
digital signal processor DSP
digital storage oscilloscope DSO
discrete Fourier transform DFT
finite impulse response FIR
gallium-arsenide GaAs
gallium-nitride GaN
high electron mobility transistor HEMT
intermediate frequency IF
laterally diffused metal oxide semiconductor LDMOS
metal semiconductor field effect transistor MESFET
monolithic microwave integrated circuit MMIC
moving target indicator MTI
normalized mean square error NMSE
phase modulation PM
power added efficiency PAE
power amplifier PA
preceding waveform PWav
pulse repetition frequency PRF
pulse-to-pulse P2P
pulse width PW
radar event message REM
radio frequency RF
root mean square RMS
signal-to-noise ratio SNR
silicon-carbide SiC
waveform of interest WoI The incorporation of gallium nitride (GaN) power amplifiers (PAs) into future high-power aperture radar systems is assured. However, the introduction of this technology into multifunction radar systems presents new challenges to radar engineers. This disclosure describes a broad investigation into amplitude and phase transients produced by GaN PAs when excited with multifunction radar waveforms. These transients result from self-heating electrothermal memory effects and are manifested as interpulse instabilities that can negatively affect the coherent processing of multiple pulses. A two time-constant behavioral model based on a Foster network has been developed to replicate the measured amplitude and phase transients accurately. This model has been used to develop a digital pre-distortion technique that successfully mitigates the effect of the transients. The moving target indicator (MTI) improvement factor and the root mean square (RMS) pulse-to-pulse stability is used as a metric to assess the effect of the transients on radar system performance and to test the effectiveness of a novel digital pre-distortion concept.

Section I—Introduction: Future Digital Array Radar (DAR) systems will be multifunction in design, supporting a diverse set of missions or functions, each requiring a specialized set of waveforms. Each waveform is specifically designed with its own duty cycle, pulse width, and requirements for optimal performance. The multifunction capabilities can cover a wide selection of functions such as air traffic control, volume surveillance, and dedicated tracking among others; all of these functions can potentially be executed simultaneously.

Phase stability is necessary to achieve a high clutter cancellation ratio, which enhances the target detection capability in a cluttered environment. Testing of solid state GaN PAs showed that, under multifunction conditions including irregular radar pulse trains, the pulse-to-pulse (P2P) stability assumption is not valid. These instabilities manifest as amplitude and phase transients and are caused by electrical and electrothermal memory effects. Other potential instabilities have been reported, such as irregular pulse train burst, different pulse power due to staggered pulse repetition frequency (PRF), and long-time (hundreds of seconds) amplitude and phase drift due to device temperature changes.

Figure 3:
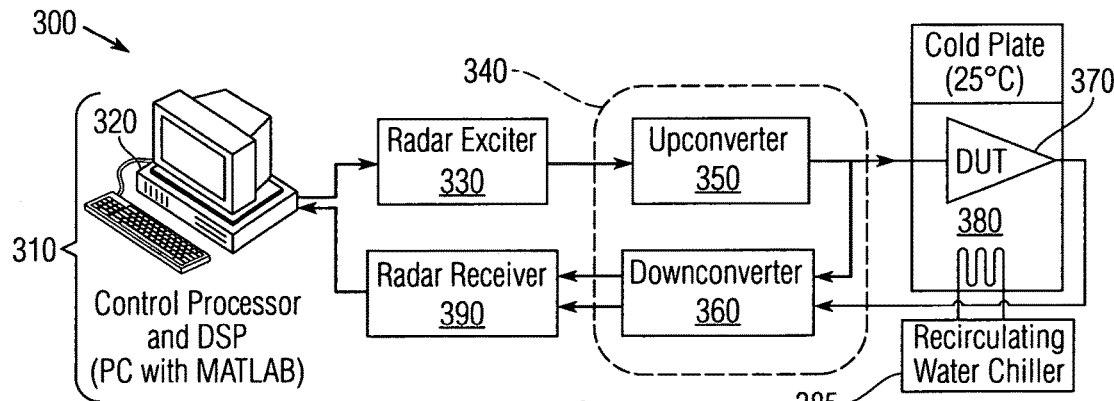
FIG. 3 is a block diagram view of a radar signal converter.

Amplitude and phase (complex gain) transients have been observed to occur over time scales of several milliseconds on CPIs where the duty cycle or pulse width varies from the previous CPI. The time varying complex gain affects the effectiveness of stationary clutter rejection in Pulse Doppler radars, which presents a significant problem. For example, MTI processing is highly sensitive to instability in the system. Characterizing these amplitude and phase transients requires a set of sophisticated equipment capable of exciting a PA with multifunction radar waveforms and collecting data for processing. An instrumentation radar and test fixture, hereafter referred to as the PA Test Fixture and further described in FIG. 3, is used to study the observed transients.

This disclosure explains the origin of the instability in GaN PAs, uses a behavioral model and radar performance metrics to assess how instability affects clutter rejection, and proposes pre-distortion as a method for mitigation. The concept behind the behavioral model is to replicate the observed amplitude and phase transients, which represents a change in the amplifier gain and insertion phase. The model delivers a single complex number value per pulse in a radar sequence. Previous contributions have included the development of a measurement technique to investigate the effect of electrothermal memory effects on multifunction radars, as well as analysis of the degraded performance of a radar transmit antenna pattern and signal processing due to memory effects. Technical literature has presented results of two different GaN PA designs, showing the behavior, duration, and magnitude of the amplitude and phase transients. This disclosure shows the results of a third GaN PA design, in addition to an exemplary behavioral model and pre-distortion technique.

The results presented here show a consistent behavior with previously reported results and results from a more recent study by J. Delprato et al.: "Measured and Simulated Impact of Irregular Radar Pulse Trains . . . ", *IEEE Microwave Theory & Techniques* 62 (12) 3538-3548 (2014) that evaluates the pulse-to-pulse stability of a GaN HEMT amplifier. They conducted circuit simulation that included RC-network to model electrothermal effects, and a one-trap drain-lag circuit to model trappings. The characteristic waveform used in the paper of eight pulses of 50 microseconds long at 20% duty cycle is followed by silence. This is parallel to the concept of multifunction radar waveforms introduced, and further developed in this disclosure. However, instead of transmitting a different waveform, the silence function being executed could be for example a received only mode, blanking zone for safety or electromagnetic interference reduction, or a primary-power management concept on a large power aperture radar system. Multifunction waveforms, as well as pulse train bursts, cause transients effects that affect the pulse-to-pulse stability and thus degrade radar performance.

A literature review of behavioral models and pre-distortion techniques has not revealed any existing model that can be directly applied to the effects observed within the context of multifunction radar waveforms. This disclosure describes an exemplary behavioral model and parameter extraction technique that can be used to model electrical and electro-thermal memory effects in multifunction radar systems. The investigation leading to this disclosure revealed that from the duration of the observed transients and amplifier architecture, the primary mechanism of the observed transient is self-heating memory effect. Conventional pre-distortion algorithm designs linearize the PA's response to reduced spectral regrowth, adjacent channel interference, inter-modulation products, and inter-symbol interference in communication systems. The maximum output power and high efficiency required for high-power aperture radars run counter to these goals. This disclosure proposes an exemplary digital pre-distortion technique that pre-distorts individual pulses within a CPI to counteract the memory effect on amplitude and phase transients while maintaining the desired power efficiency. The exemplary pre-distortion technique was implemented and tested using a PA Test Fixture and the developed behavioral model. The MTI Improvement Factor and Root Mean Square (RMS) Pulse-to-Pulse (P2P) stability were used to quantify the effectiveness of the pre-distortion. These two metrics offer different insights into system stability.

Section II—GaN MMIC in future radar systems: Active phased arrays employ solid state PAs in their final amplification stage. The field has been dominated primarily by two technologies, i.e., the silicon (Si) laterally diffused metal oxide semiconductor (LDMOS) and the gallium arsenide (GaAs) field effect transistor (FET). LDMOS has a lower cost than GaAs technology; however, its maximum frequency of operation is typically limited to less than 3.5 GHz. GaAs FET devices can be used to much higher frequencies (above 100 GHz). Historically, MMIC development began in the 1960s. The primary users of this technology at the time were involved in military and space applications. MMICs enable a complete radio frequency (RF) design, often with inputs and outputs matched to a 50 ohm ($\Omega$) load. They have several advantages over designs using discrete components, including smaller size, reproducibility, and reliability. Fielded active phased array radar systems almost exclusively use GaAs MMICs in their final amplification stage. Historically, MMICs always referred to a GaAs FET's MMIC. However, this is no longer the case due to the introduction of the gallium nitride (GaN) MMIC in the mid-2000s. The GaN MMIC has emerged as the best option to replace GaAs for high-power aperture radars. GaN semiconductors have more favorable properties than other technologies such as Si LDMOS or the GaAs metal semiconductor field effect transistor (MESFET). GaN devices have a higher breakdown voltage, which provides a large drain voltage and leads to high output impedance per watt of RF power. GaN technology enables easier matching and lower loss matching circuitry. GaN reliability is very promising, with accelerated life testing (ALT) predictions in excess of $5 \times 10^6$ hours and degradation mechanisms consistent with source metal intermixing. Overall, the introduction of GaN MMICs in future radar systems is certain.

Section III—Memory Effects: As defined herein, memory effects are changes in the amplifier's gain and phase insertion due to previous radar CPIs. The influence of the previous CPI spans several milliseconds. This is significantly different than the scenarios applicable to most communication systems, where the primary concerns are the spectral purity of the output signal, linearity, spectral regrowth, and adjacent channel interference. Conversely, the focus for radar systems is maximizing output power and efficiency. Memory effects are produced by many factors, including self-heating, biasing networks, charge trapping, and matching networks. A GaN PA, being the device under test (DUT) used for this investigation, was biased with constant gate and drain voltages, limiting trapping charge and discharge mechanisms. A large energy storage capacitor located electrically close to the drain terminal reduces the drain bias network memory effect. This facilitates isolation of self-heating as the root cause of the amplitude and phase transients observed. This investigation limited consideration to only self-heating.

Self-heating refers to an unavoidable increase in temperature inside a device due to heat dissipation: an increase in channel or junction temperature over the package temperature. The rapid temperature cycling that occurs inside the device alters its gain and linearity. Properties of semiconductor materials and devices are temperature sensitive. For example, the thermal resistance and the specific heat of GaN and silicon carbide (SiC) increase with temperature. The high thermal conductivity of SiC, 130 W/(m·K), facilitates heat transfer from the channel to the case. This, combined with the high-power density of GaN devices, suggests a significant difference in channel temperature between the ON and OFF states of a pulsing device.

The biasing network is used to energize the device properly, while stopping the propagation of RF into the power supply lines. The biasing network influences the memory effects observed in PAs. The use of high capacity energy storage electrically close to the device drain mitigates the memory effect, thereby eliminating this mechanism as a major contributor to the observed amplitude and phase transients. Charge trapping is a phenomenon that influences the performance of GaN devices by introducing parasitic charges that limit high frequency output power. The trappings responsible for degradation in the microwave performance of aluminum-gallium-nitrate (AlGaN)/GaN devices are located at the surface and in the underlying semiconductor buffer layers. Charge trapping is associated with a recoverable reduction in drain current and thus power output over time. The time-constant associated with charge trapping depends on the process used to build the device and can vary widely with temperature, ranging from microseconds to minutes. Trapping effects have been largely eliminated due to modern device manufacturing processes, and the fact that gate and drain voltage are kept at a constant bias. Thus, this mechanism is regarded as a minor contributor to the observed amplitude and phase transients. A matching network is circuitry built at the input and output of transistors to match the impedances of the device to a load (standardized to 50$\Omega$ for most RF and wireless devices), enabling maximum power transfer and minimum reflected power. The memory effects induced by the transistor matching network are of short duration, up to several nanoseconds, and were discounted.

Exemplary embodiments provide for techniques to correct pulse radar signals from effects caused by previous signals through the power amplifier. This begins with characterizing effects on the power amplifier from reference signals. FIG. 1 shows a block diagram view 100 of a process for power amplification characterization. The process begins at start 105 and proceeds to a Waveform Sequence Pair (WSP) 110 that initiates a loop. The WSP 110 continues to a waveform synthesis 120, which branches to a power amplifier 125 to produce an amplified sample signal 130, which is digitized to produce a digital output sample signal 140. The waveform synthesis 120 also produces a reference signal 150. The output sample signal 140 and the reference signal 150 are input to a pulse cross correlation processor 160 to conduct a peak search and time stamp 170 for each pulse in the CPI. The results of the peak of cross correlation 175 are stored. After the last pulse in the CPI is processed, a decision query 180 asks whether a new WSP 110 is received from a WSP Table 190. If no new WSP is available, then the process terminates at end 195. Otherwise the process returns to schedule WSP 110.

Exemplary embodiments mitigate the evaluated power amplifier effects through pre-distortion correction. This process incorporates a Radar Event Message (REM) that includes pulse waveform parameters such as reference name, pulse modulation (e.g., continuous wave), modulation bandwidth (hertz), pulse width (seconds), pulse duty cycle (percentage of bandwidth) and number of pulses.

Figures 2, 8A:
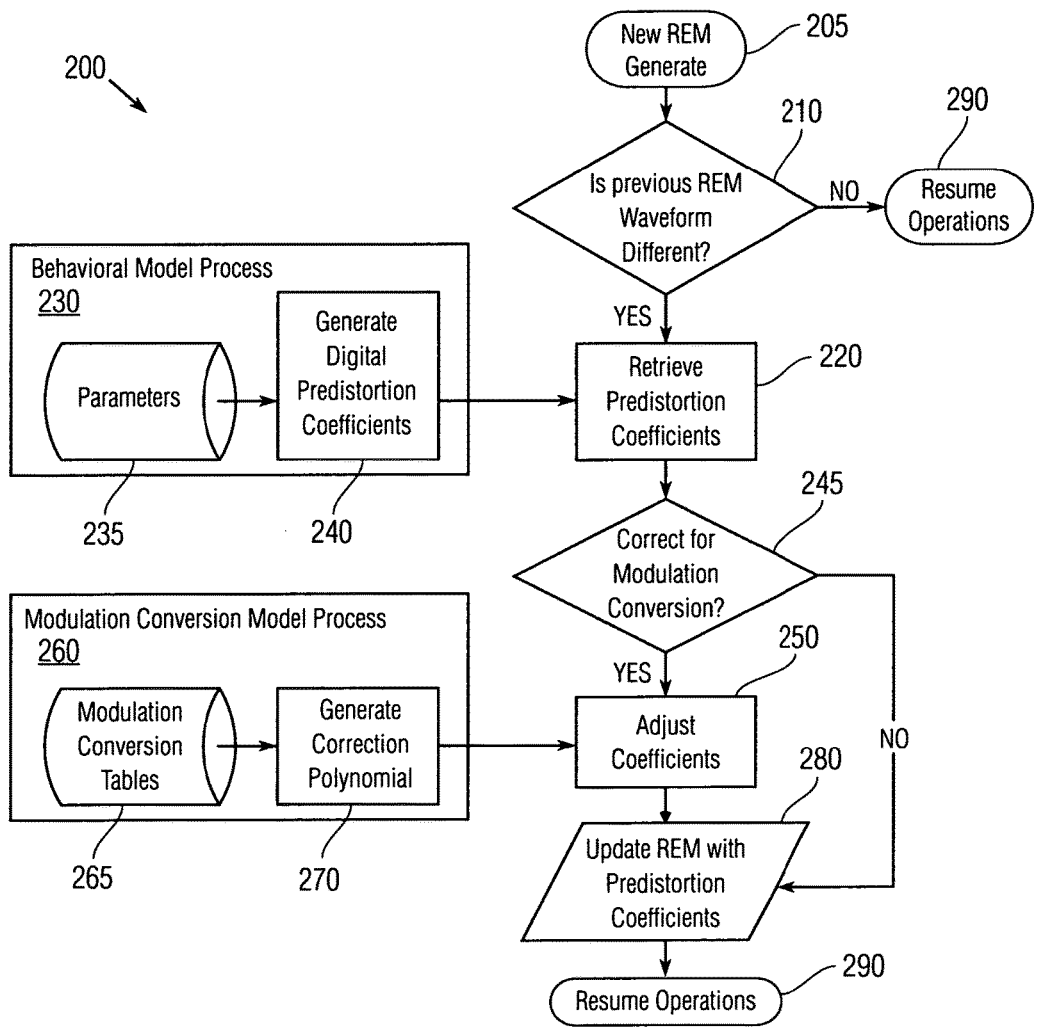
FIG. 2 is a block diagram view of an algorithm process for generating pre-distortion coefficients.
FIGS. 8A and 8B are a tabular views of material and waveform parameters.

FIG. 2 shows a block diagram view 200 of an algorithm process for generating pre-distortion coefficients. The process begins with generation of a new REM 205 and proceeds to a decision comparison 210 on whether the current (i.e., new) REM differs from the previous REM waveform. Upon determining a difference, the process proceeds to retrieve pre-distortion coefficients 220 from a behavioral process model 230 that includes parameters 235 to generate digital pre-distortion coefficients 240. An alternative to parameters 235 involves utilizing the measured parameters collected during characterization process 100. The process proceeds to a decision query 245 for whether to correct for modulation conversion. If so, then the process continues to a modulation correction processor 250 to adjust the coefficients based on a modulation conversion model 260 that includes modulation conversion tables 265 to generate a correction polynomial 270. This modulation can include amplitude modulation-to-amplitude modulation and/or amplitude modulation-to-phase modulation, as described subsequently. Following coefficient adjustment, the process continues to update the REM with pre-distortion coefficients 280. If modulation correction is unnecessary, the second query 245 bypasses adjustment and proceeds to the update operation 280. Following the update 280 having performed the correction, or else if the previous and current REM waveforms are the same from comparison 210, the operation resumes 290.

Section IV—Power Amplifier Test Fixture: Transmitting multifunction radar waveforms using a GaN PA produces amplitude and phase transients in the radiated signal that can be detrimental to radar performance. One cannot observe these conditions using a typical Network Analyzer. A sophisticated set of instruments is required to rapidly and predictably change waveforms and to capture the entire CPI for data analysis. FIG. 3 shows a block diagram view 300 of a radar signal converter 310. A DSP-equipped control processor 320 provides a radar excitation signal 330, which proceeds to a converter assembly 340 that includes an up-converter 350 and a down-converter 360. The signal proceeds from the up-converter 350 to a Device Under Test (DUT) amplifier 370 mounter to a cold plate 380, cooled by a recirculating water chiller 385. The DUT 370 constitutes an exemplary power amplifier 125 for purposes of signal characterization. The amplifier signal from the DUT 370 and a reference signal from the up-converter 350 proceed to the down-converter 360, which forwards both to a radar receiver 390 for receipt by the control processor 310. The PA Test Fixture 310 was developed to stimulate the power amplifier 125 with representative multifunction radar waveforms. The parameters measured were analogous to the $S_{21}$ scattering parameter (forward transmission coefficient or gain) in that both the input signal to the amplifier (DUT) and its output were down-converted and digitized, enabling the amplitude and phase to be measured across each pulse, but with a large instantaneous bandwidth. The PA Test Fixture 310 was designed to respond similarly to a DAR, but to perform pulse compression and signal processing in non-real-time after data collection. A total of two exciters and four receivers were implemented using laboratory instrumentation and equipment. These enable the implementation and validation of a predistortion algorithm.

A MATLAB instrument control toolbox is used to control all equipment and instrumentation, to create sequences of radar waveforms (CPIs), and to compute and evaluate behavioral model candidates. The radar digital exciter is a two-channel arbitrary waveform generator (AWG) used to generate the radar waveforms scheduled by the Control Processor 320 as signals 330. One example is the Tektronix AWG5012 AWG. The up-converter 350 and down-converter 360 constitute a two-stage converter assembly 340, designed to support a large tuning range between 2.9 GHz and 3.4 GHz (lower portion of the super high frequency spectrum) with an instantaneous bandwidth of 100 MHz. The exemplary DUT amplifier 370 is a CREE CMPA2735075F high-electron-mobility transistor (HEMT) GaN MMIC capable of delivering more than 75 watts of peak pulse power between the frequencies of 2.7 GHz and 3.5 GHz. The design features two stages of amplification integrated into the MMIC. The DUT 370 is mounted in a demonstration amplifier circuit (CMPA2735075F-TB), bolted onto a base plate 380, which is controlled via a water recirculating chiller 385 maintained at 25° C. The radar receiver 390 represents a four-channel digital storage oscilloscope (DSO) employed to digitize multiple signals streaming after down-conversion. All waveform signals are at an intermediate frequency (IF) of 187.5 MHz and are digitized at a sampling frequency of 50 mega samples per second. The analog bandwidth is reduced to 20 MHz via band pass filters immediately before the digital receiver.

Figure 4:
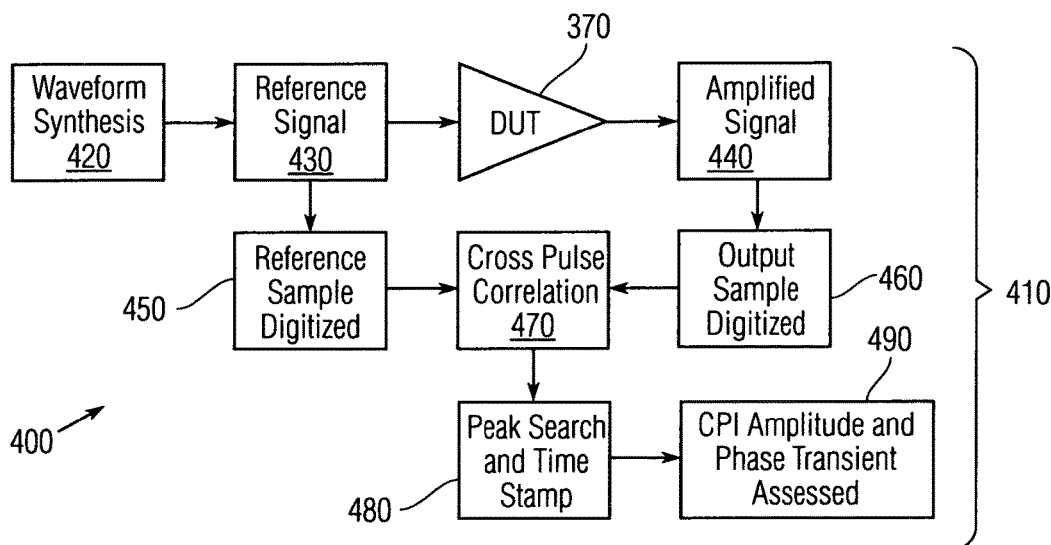
FIG. 4 is a block diagram view of a signal processor.

FIG. 4 shows a block diagram view 400 of a signal processor 410. This process is embedded in the power amplifier characterization process 100. A waveform synthesizer 420 synthesizes waveforms from which a select portion of those signals is used as a reference signal 430. These are branched for feeding to the DUT 370 and to a reference digitizer 440 for digital down-converting into baseband by the down-converter 360. The DUT 370 provides an amplified signal 450 for which a select portion is submitted to an output digitizer 460 for digital down-converting into baseband by the down-converter 360. A pulse cross-correlation analyzer 470 receives digitized signals from the reference digitizer 440 and the output digitizer 460 for analysis to yield peak search and time stamp 480 for identification and indexing of correlation result to its corresponding position within the CPI. This information is submitted for assessment 490 to obtain CPI amplitude and phase transient characteristics, later being used to find behavioral model parameters.

Figure 5:
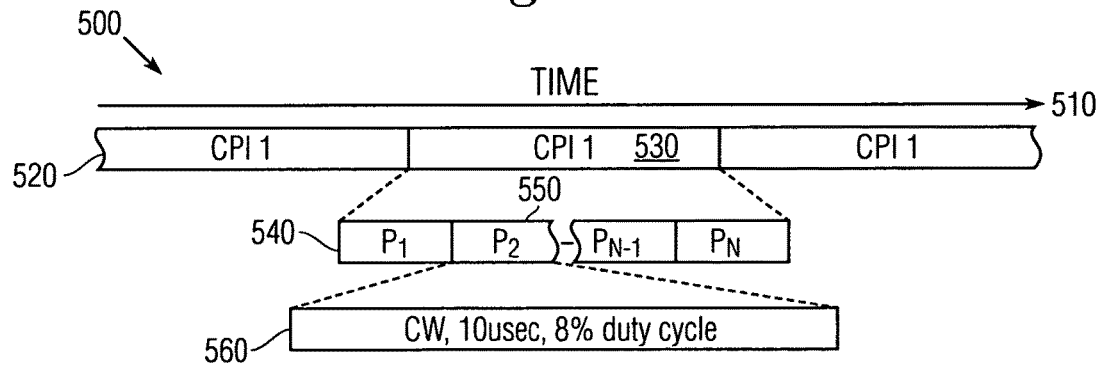
FIG. 5 is a single function sequence view of a first process timeline.

FIG. 5 shows a single function sequence diagram view 500 of a first process timeline 510. A first chronological coherent processing interval (CPI) sequence 520 includes CPI 1 530 with a pulse sequence 540 of N pulses $P_1$, $P_2$, ... $P_{N-1}$, $P_N$. The second parameter $P_2$ 550 of the sequence 540 includes characteristics 560 of being continuous waveform (CW), 10 μs pulse width (PW) with an 8% duty cycle (DC). All pulses in sequence 540 have identical properties with the parameters.

Figure 6:
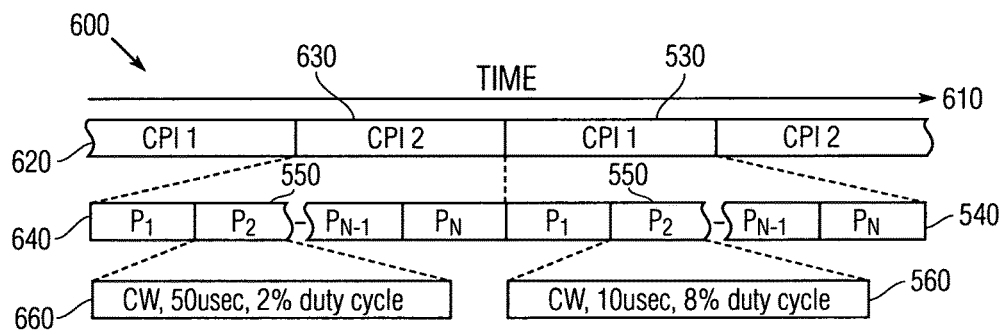
FIG. 6 is a multifunction sequence view of a second process timeline.

FIG. 6 shows a multifunction sequence diagram view 600 of a second process timeline 610. A twin-CPIs sequence 620 includes CPI 1 530 and CPI 2 630. These can be expanded into their respective pulse sequences 540 and 640 each with N pulses $P_1$, $P_2$, ... $P_{N-1}$, $P_N$. The pulse parameter $P_2$ 550 of the first sequence 540 includes characteristics 560 of being CW, 10 μs PW with an 8% DC and a series integer N of thirty-two (i.e., 32 pulses). The pulse parameter $P_2$ 650 of the second sequence 640 includes characteristics 660 of being CW, 50 μs PW with a 2% DC and a series integer N of eight (i.e., 8 pulses). In this multifunction sequence 620, different waveforms are transmitted consecutively, such that the pulse width and duty cycle between CPI 1 530 and CPI 2 630 changes significantly. Other multifunction sequence examples can include waveforms that can vary significantly in their pulse width and duty cycle.

Figure 7:
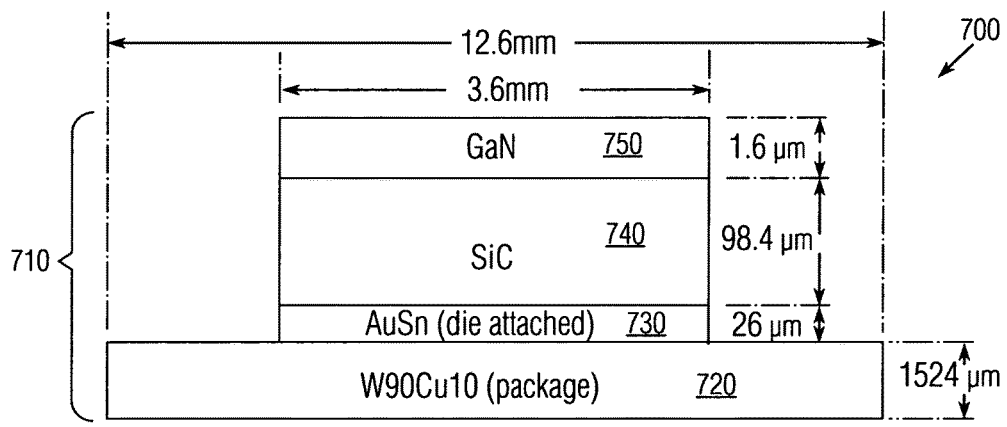
FIG. 7 is an elevation cross-section view of a semiconductor structure.

FIG. 7 shows an elevation cross-section view 700 of a semiconductor package structure 710. A substrate 720 of 90% tungsten (W) and 10% copper (Cu) by weight constitutes a package platform of 1.524 mm in thickness. A die-attach 730 composed of silver-tin (Au Sn) of 0.026 mm is disposed onto the substrate 720. A semiconductor 740 of silicon carbide (SiC) of 0.0984 mm is overlaid on the die-attach 730. A semiconductor 750 of gallium nitride (GaN) 0.016 mm in thickness is further laid on the semiconductor 740.

Figures 8B, 9:
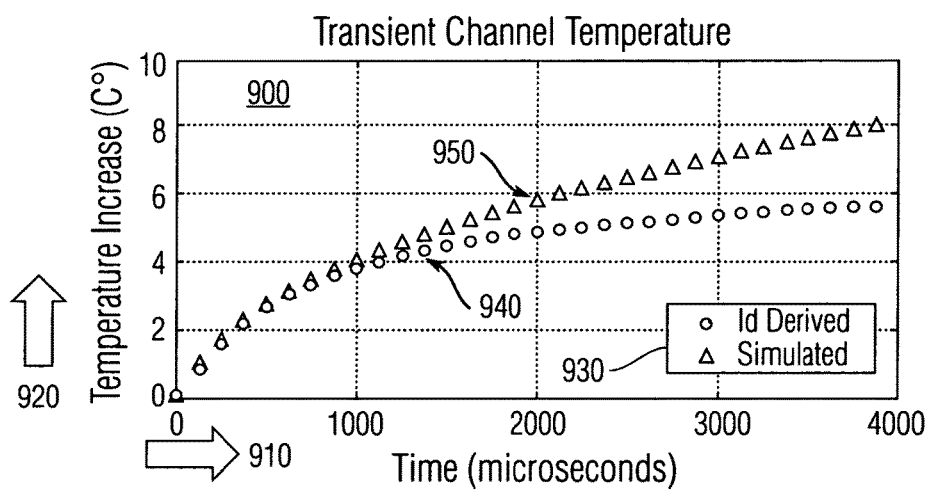
FIG. 9 is a graphical view of transient channel temperature.

FIG. 8A shows a tabular view 800 in Table I of material characteristics for package layers in a stack configuration 710 from view 800. The columns include layer 810, specific heat 820, density 830 and thermal conductivity 840. The materials include tungsten copper ($W_{90}Cu_{10}$), gold tin (AuSn), silicon carbide (SiC) and gallium nitride (GaN). FIG. 8B shows a tabular view 850 in Table II of waveform parameters 860 to simulate multifunction sequences for column CPI 1 870 and column CPI 2 880 in columns. These parameters 860 include pulse repetition frequency (PRF) and CPI duration. The values identified in columns 870 and 880 correspond to respective pulse parameter characteristics for 560 and 660.

FIG. 9 shows a plot view 900 of transient channel temperature. The abscissa 910 denotes time in μs, while the ordinate 920 denotes temperature increase in degrees Celsius (° C.). A legend 930 identifies data conditions. The filled circles 940 denote derived values, whereas the filled triangles 950 denote simulated values. The derived and simulated values remain substantially similar until about 0.8 ms at 3.5° C., and diverge thereafter. The derived circles 940 almost reach 6° C. by 4.0 ms, while the simulated triangles 950 continue rising past 8° C. by that time.

System Dynamic Test Requirement: The PA Test Fixture 310 captures and processes the entire CPI. Each captured pulse is stored in memory for processing. The system measures minute changes in the DUT's complex gain that occur during the duration of a CPI. The gain differences observed were small; gain changes on the order of 0.1% and phase changes on the order of 0.05 electrical degrees necessitated careful measurement. This required a large dynamic range, experimentally determined to be more than 60 dB. The single shot (pre-cross-correlation) signal-to-noise ratio (SNR) was close to 48 dB. At least a 20 dB increase in the SNR is needed to characterize the DUT 370 properly. This was achieved by using cross-correlation (match filtering) in addition to averaging multiple data captures.

Section V—DUT Characterization: To characterize the DUT 370, one must first set an operating point. The condition selected was for maximum power added efficiency (PAE) at 3.2 GHz calculated at 49.6% for an output power of 49.3 dBm and a gain of 21.4 dB. The system calibration sequence includes a single CPI fed to the DUT 370 in a continuous loop, with all of the pulses within the CPI being identical. This brought the device to equilibrium. Thus, there were no observable amplitude or phase transients in the analyzed data. FIG. 5 shows the sequence diagram view 500 of the first process timeline 510 used. Notice that CPI 1 530 is repeated in perpetuity and that each CPI contains N pulses, each having identical properties. FIG. 6 shows the sequence diagram view 600 of the second process timeline 610. The second CPI sequence 620 includes CPI 1 530 and CPI 2 630.

Table II in FIG. 8B shows the waveform parameters used to acquire data. CPI 1 530 is the waveform that was captured and analyzed. CPI 2 630 is the waveform used to imitate a multifunction sequence, discussed subsequently. For simplicity, only the center frequency of 3.2 GHz was used to collect data during this example. To compare the similarities between two consecutive pulses, and later to qualitatively compare the behavioral model, the normalized mean square error (NMSE) is used as defined:

$$NMSE_{dB} = 10 \cdot \log_{10}\left(\frac{\sum_{n=1}^{N}|y_{meas}[k] - y_{model}[k]|^2}{\sum_{n=1}^{N}|y_{meas}[k]|^2}\right), \quad (1)$$

where, $y_{meas}$ is the measured signal, $y_{model}$ is the modeled signal and k is the data index. To compare two consecutive pulses, the first pulse is assigned to $y_{meas}$, and the second pulse to $y_{model}$. After reaching thermal equilibrium, a single CPI was captured for analysis. Both the input 430 to the DUT 370 and its amplified output 450 were digitized for two consecutive pulses, using a single CPI data capture.

Figure 10:
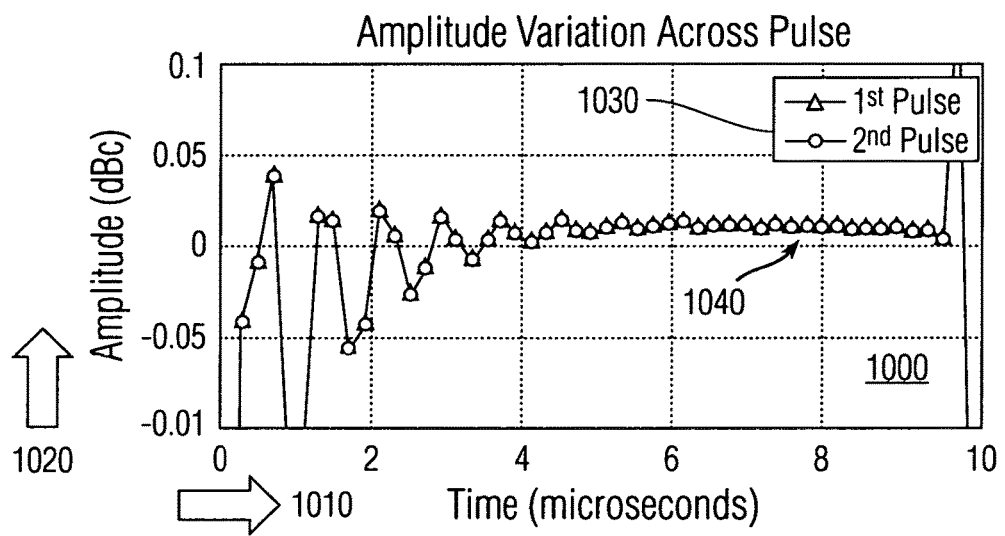
FIG. 10 is a graphical view of an amplitude temporal variation between consecutive pulses.
Figure 11:
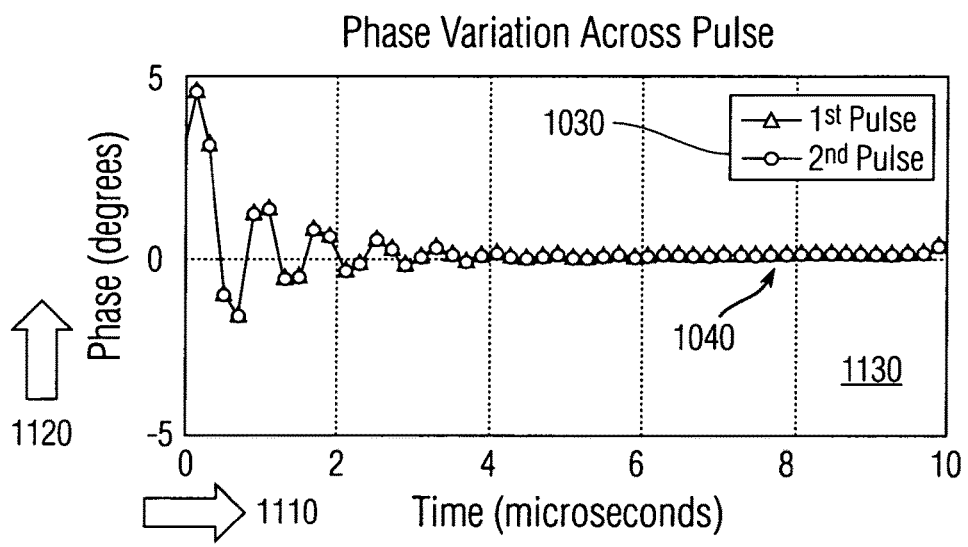
FIG. 11 is a graphical view of phase temporal variation between consecutive pulses.

FIGS. 10 and 11 show plot views of power envelope and phase offset of two consecutive pulses in a calibration sequence in CPI 1 530, which is repeated in perpetuity. The pulse shape is not significantly affected. FIG. 10 shows a plot view 1000 of pulse amplitude temporal variation. Amplitudes were normalized in reference to the first pulse. The abscissa 1010 denotes time in micro-seconds (μs), while the ordinate 1020 denotes amplitude across a CPI in decibels-carrier (dBc). A legend 1030 identifies values for first and second pulses as respective filled circles and filled triangles plotted as a line 1040, which shows the pulse amplitudes are identical between these pulses. FIG. 11 shows a plot view 1100 of phase offset across the pulse normalized to the first pulse. The abscissa 1110 denotes time in microseconds (μs), while the ordinate 1120 denotes phase across the CPI in degrees (°). A legend 1130 identifies values for first and second pulses as respective filled circles and filled triangles plotted as a line 1140, which shows the phases are identical between these pulses. Both lines 1040 and 1140 for amplitude and phase show oscillatory variation that damps down to values near zero, especially after five microseconds. One can observe that apart from system noise, the pulses have identical shape for their respective amplitude and phase. Both FIGS. 10 and 11 show ringing in amplitude and phase, which is typical of Class AB high PAs. The important characteristic observed was that at steady state operation, any two consecutive pulses from a calibration waveform were identical. The NMSE for two consecutive pulses is −43.5 dB.

Figure 12:
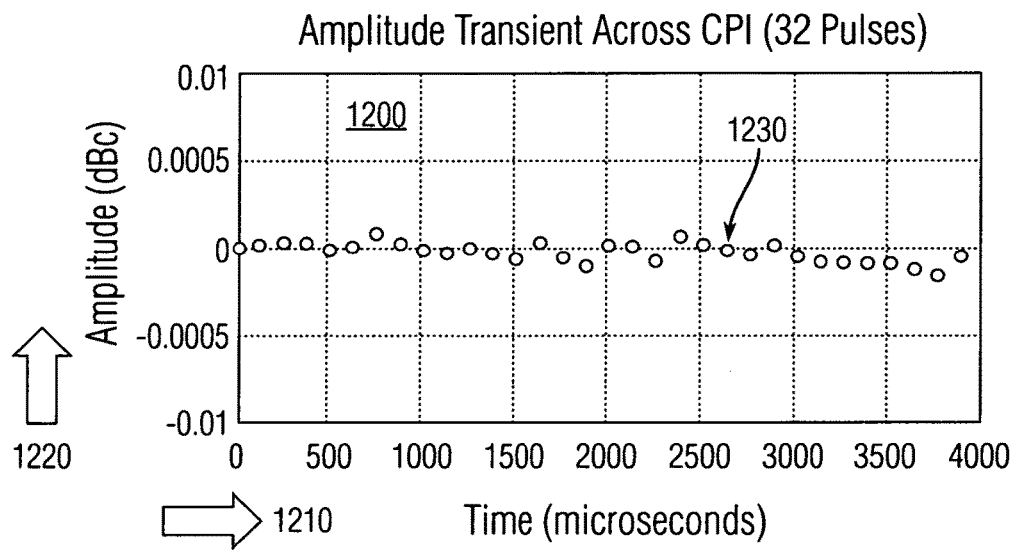
FIG. 12 is a graphical view of amplitude temporal variation across a coherent processing interval (CPI)
Figure 13:
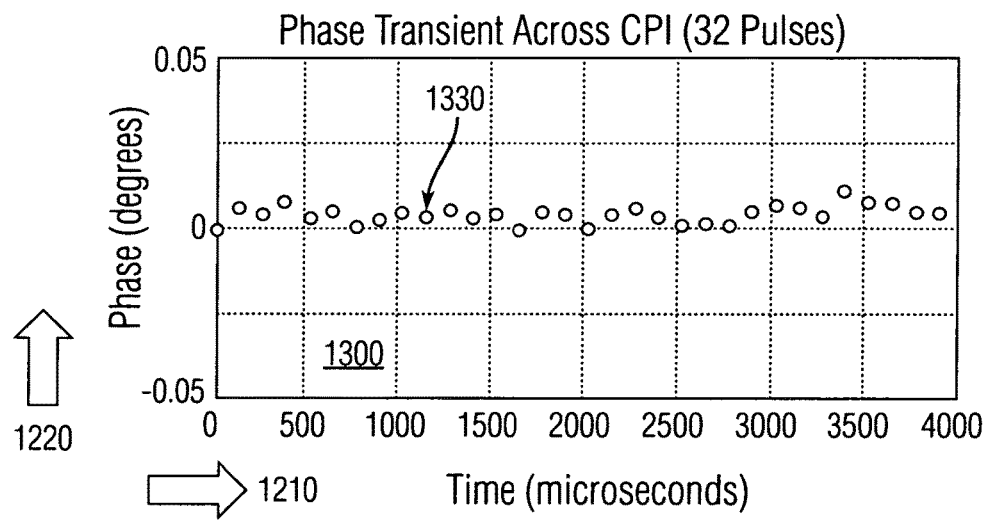
FIG. 13 is a graphical view of phase temporal variation across a CPI.

Following the procedure discussed in Section IV, FIGS. 12 and 13 show the amplitude gain and phase insertion variation associated with the indexed cross-correlation peaks of DUT gain variation for the entire CPI 1 530 of 32 pulses. FIG. 12 shows a plot view 1200 of the results from eqn. (2) in decibels. The abscissa 1210 denotes time in micro-seconds (μs), while the ordinate 1220 denotes amplitude across a CPI in decibels-carrier (dBc). Amplitude values are shown as filled circles 1230, with all values remaining a band of ±0.002 dBc. FIG. 13 shows a plot view 1300 of the results from eqn. (3) in degrees. The abscissa 1310 denotes time in micro-seconds (μs), while the ordinate 1320 denotes phase across the CPI in degrees (°). Phase values are shown as filled circles 1330, with all values remaining within ±0.01°. Because thermal equilibrium was reached and identical CPIs were repeated, the results showed that there were no transients; instead, only system noise was observed. The physical meaning is that the DUT 370 experienced no appreciable change in complex gain during CPI 1 530 when being used in the calibration sequence 500. Using a discrete Fourier transform (DFT) analysis to estimate the system noise after processing, reveals an SNR of approximately 83 dB. The high SNR is achieved by performing pulse compression (i.e., matched filtering) on the received pulses, and averaging several data captures. The measurement precision for the amplitude and phase was estimated to be ±0.0006 dB for amplitude and ±0.004° for phase.

In multifunction radar systems, waveforms are changed frequently; therefore, the operating conditions for PAs and supporting equipment (e.g., power supplies) changes as well. This raises the GaN device's channel temperature (presented in FIG. 9), changing the device's complex gain, which ultimately distorts the transmitted signal. FIG. 6 shows the multifunction sequence 610, where two radar waveforms are fed to the DUT 370 in perpetuity. CPI 1 530 is the waveform used for the calibration sequence and data analysis, while CPI 2 630 is the additional waveform with significantly different pulse parameters (refer to Table I in FIG. 8A for cross-section elevation view of stack device 710 in FIG. 7). The synthesized pulses inside a CPI are identical.

Figure 14:
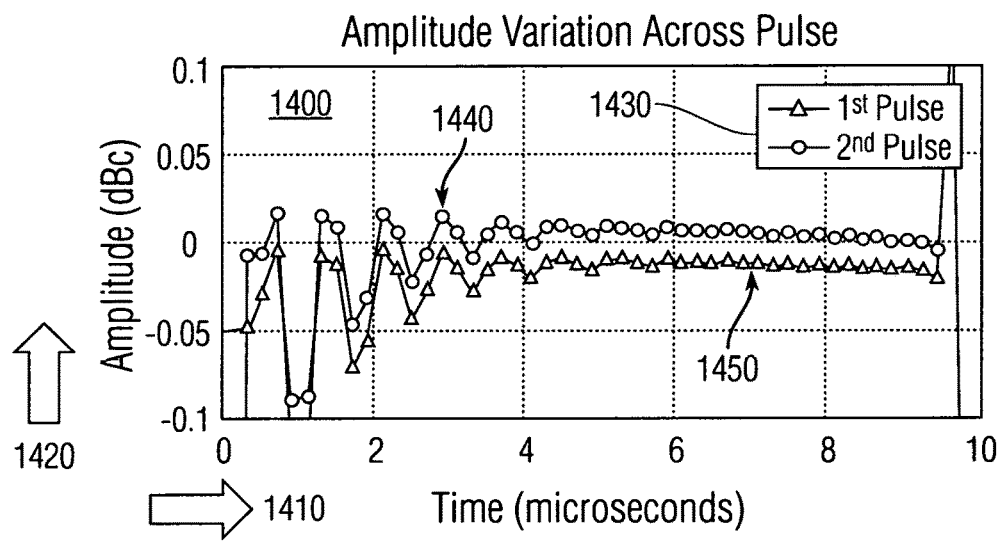
FIG. 14 is a graphical view of amplitude variation between first two consecutive pulses during multifunction operation.
Figure 15:
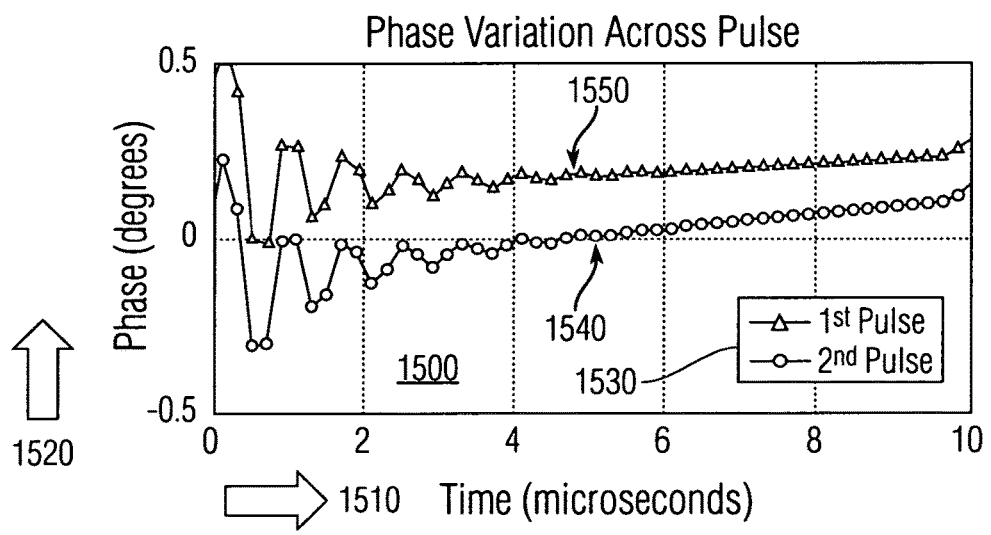
FIG. 15 is a graphical view of phase variation between first two consecutive pulses during multifunction operation.

FIGS. 14 and 15 illustrate the power envelope and phase offset across the first two consecutive pulses in CPI 1 530. The pulse shape is not significantly affected. The pulse amplitude envelope exhibits a small but measurable offset. Because the input signal has constant amplitude, the amplifier exhibits a drop in gain of about 0.02 dBc. FIG. 14 shows a plot view 1400 of amplitude offset of the first two consecutive pulses in the multifunction waveform sequence. The abscissa 1410 denotes time in microseconds (μs), while the ordinate 1420 denotes amplitude across a CPI in decibels-carrier (dBc). A legend 1430 identifies sequential pulses. The filled circles 1440 identify the first pulse while the filled triangles 1450 identify the second pulse. FIG. 15 shows a plot view 1500 of phase offset of the first two consecutive pulses in a multifunction waveform sequence. A noticeable phase offset can be observed between the pulses starting at 3° and diminishing gradually to 1° at the end of 10° μs, indicating that the amplifier's insertion phase has also changed. The abscissa 1510 denotes time in microseconds (μs), while the ordinate 1520 denotes phase across the CPI in degrees. A legend 1530 identifies sequential pulses. The filled circles 1540 identify the first pulse while the filled triangles 1550 identify the second pulse.

Figure 16:
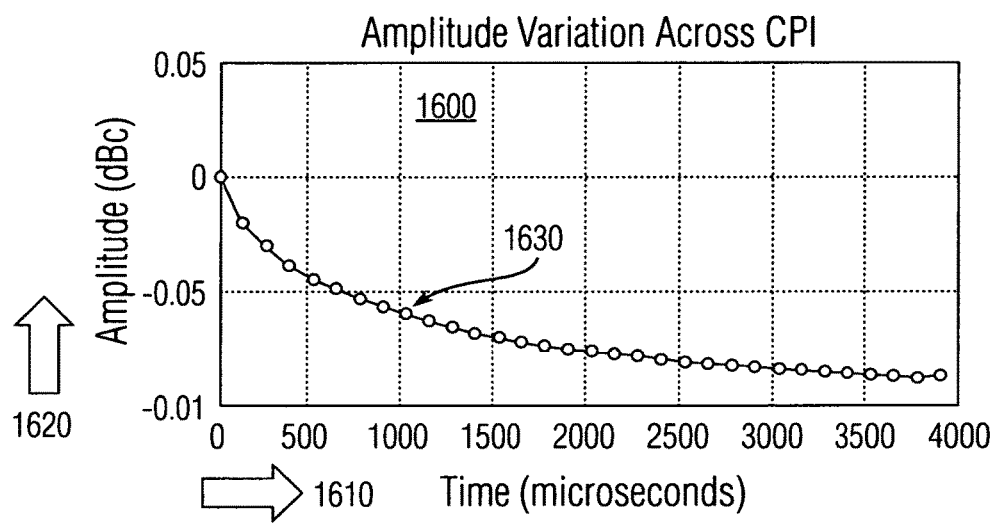
FIG. 16 is a graphical view of amplitude temporal variation across a CPI.
Figure 17:
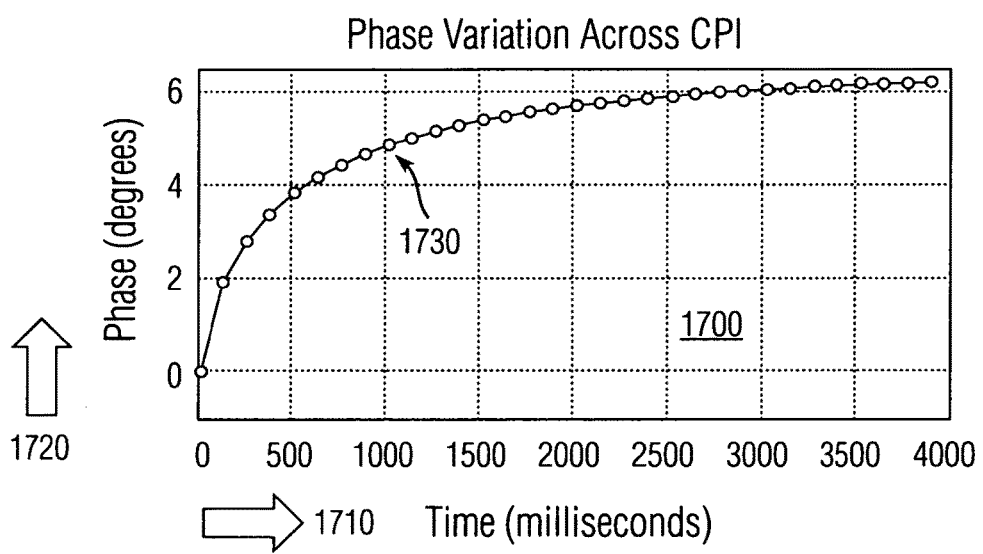
FIG. 17 is a graphical view of phase temporal variation across a CPI.
Figure 18:
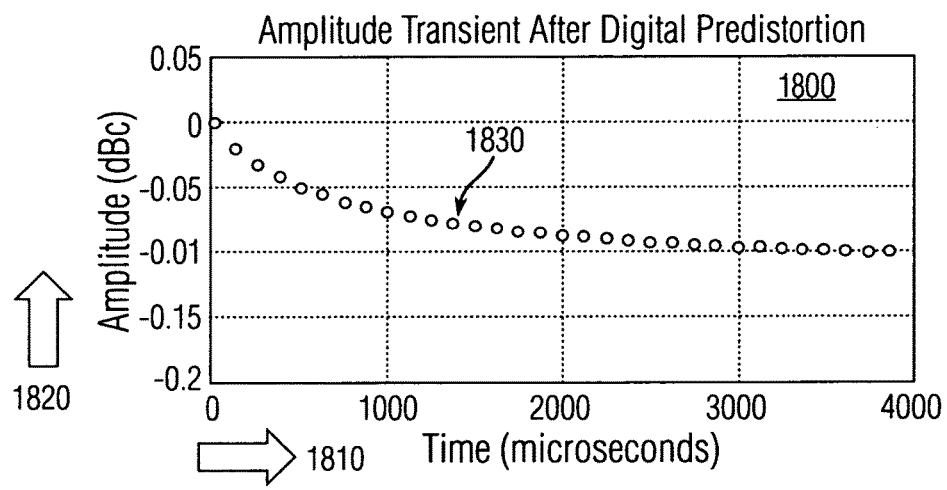
FIG. 18 is a graphical view of amplitude variation after pre-distortion.
Figure 19:
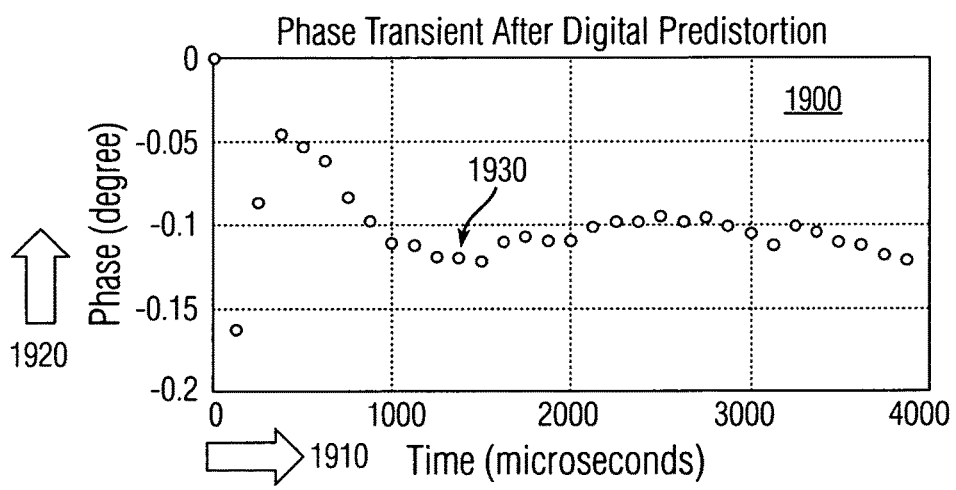
FIG. 19 is a graphical view of phase variation after pre-distortion.

The resulting amplitude and phase transient analysis is illustrated in FIGS. 16 and 17 with change caused by waveform CPI 2 630 preceding waveform CPI 1 530. FIG. 16 shows a plot view 1600 of amplitude transient across a CPI; the abscissa 1610 denotes time in microseconds (μs), while the ordinate 1620 denotes amplitude across a CPI in decibels-carrier (dBc). The filled circles 1630 signify transient values of amplitude as a function of time, asymptotically approaching −0.09 dBc after about 4 milliseconds. FIG. 17 shows a plot view 1700 of phase transient across a CPI, the abscissa 1710 denotes time in microseconds (μs), while the ordinate 1720 denotes phase in degrees. The filled circles 1730 signify transient values of phase as a function of time, asymptotically rising to 6° in about 3.5 milliseconds. For explanatory contrast. FIGS. 18 and 19 show amplitude and phase transients from waveform temperature change after digital pre-distortion, to be described subsequently. FIG. 18 shows a plot view 1800 of amplitude change from the preceding cooler waveform after pre-distortion. The abscissa 1810 denotes time in microseconds (μs), while the ordinate 1820 denotes amplitude across a CPI in decibels-correction (dBc). The filled circles 1830 signify corrected transient values of amplitude as a function of time, asymptotically approaching −0.10 dBc after about 3 milliseconds. FIG. 19 shows a plot view 1900 of phase from the preceding cooler waveform after pre-distortion. The abscissa 1910 denotes time in microseconds (μs), while the ordinate 1920 denotes phase across the CPI in degrees. The filled circles 1930 signify transient values of phase as a function of time, oscillating about to −0.11° after about one millisecond.

CPI 1 530 was preceded by a significantly different waveform as CPI 2 630. The waveforms differences are such that the DUT's channel temperature transitions from a cooler state to a warmer state. The gain in FIG. 16 decreased as the CPI progressed across the 32 pulses, as did the output power. The gain dropped by as much as 0.09 dB across CPI 1 530, and the drain current dropped by 2.1%. This implies that the gain change resulted from a decrease in drain current. A phase transient of several degrees was also observed. FIG. 17 shows a phase transient of more than 6° across CPI 1 530. The amplitude and phase transients as described are detrimental to radar performance. This is due to the fact that during radar operations, these transients (interpulse instabilities) are transmitted into space. The received echo is corrupted by the instability, thus decreasing the radar's performance against clutter. The results presented in this section are consistent with those reported. Additional details regarding the extent to which this can affect radar performance are discussed in Sections VII and VIII.

Section VI—Behavioral Model: The exemplary model intends to replicate the change in complex gain observed in the DUT 370 based on the previous stimuli. This operates at the level of baseband envelope domain post-pulse compression (cross-correlation), which is appropriate for pulse radar applications. The model parameters are stored in a lookup table for later use. No information is needed regarding either the device's internal design or its physics to develop a model that accurately describes the behavior of the DUT 370 excited with a known stimulus.

Pulse radar waveforms are selected from a large, but finite, library, and are almost exclusively constant envelope in order to maximize output power and efficiency. This example uses previously established stimuli to excite the DUT 370 to various states for parameter extraction. The exemplary behavioral model predicts the outcome of any possible combination of waveforms, within the dimensional space of the waveforms, tested with a memory window limited to 20 milliseconds. The memory window was determined experimentally, as this memory depends on the behavior of the selected amplifier and the system-specific parameters. The transients represent changes in the amplifier's complex gain. The intricate pulse shape, which includes interpulse distortion, is predominantly conserved from pulse to pulse. The most noticeable differences are changes in the amplifier's gain and insertion phase. The exemplary model's concept is to replicate those changes, where each pulse is assigned a single complex number value representing the gain and insertion phase change (that correspond to changes of in-phase amplitude and quadrature).

FIGS. 16 and 17 illustrate the transient response of the DUT 370 when the scheduler changes from CPI 2 630 to CPI 1 530. The observed behaviors resemble exponentially decaying functions. The primary cause of the observed transients is due to thermal transients that occur within the DUT 370, and thus equations of circuit topologies are typically used to fit and model thermal transients. Circuit topologies are used due to the analogy between Fourier's Law and Ohm's law where, the rate of heat flow (Q) is to current (I), temperature difference (ΔT) is to voltage (ΔV), thermal resistance (θ) is to resistance (R) and thermal capacitance (C) is to electrical capacitance (C). A resistor-capacitor (RC) tank configuration (Foster ladder network topology) was chosen to model the observed behavior. The Foster topology is widely used as a thermal equivalent circuit to model system's thermal transient response. This is due to convenience, as other topologies such as the Cauer network provide better physical representation on their internal nodes, but are difficult to analyze.

Figure 20:
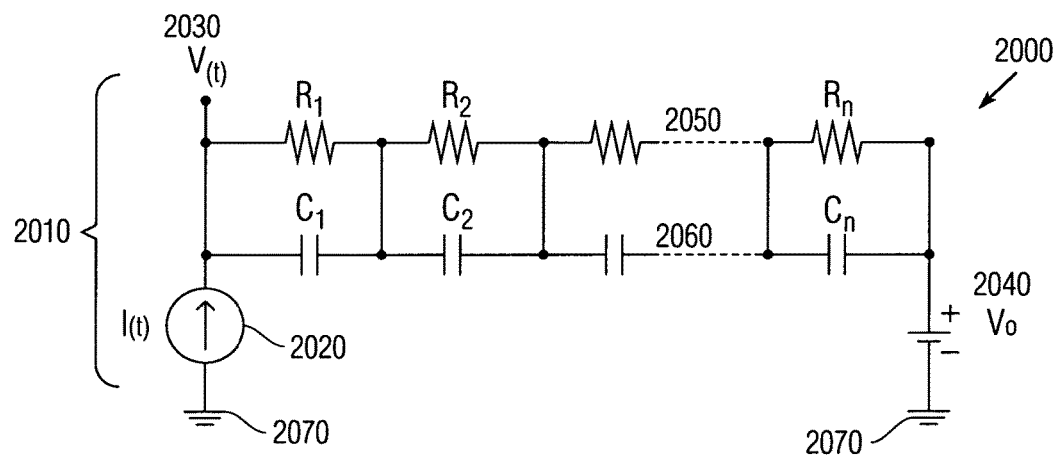
FIG. 20 is a circuit diagram view of an RC experimental configuration.

FIG. 20 shows a topological circuit diagram view 2000 of this Foster tank-circuit ladder network 2010. This behavioral model for amplitude transient is based on two tank-circuit, while phase transient requires a third circuit. A current source 2020 with a voltage potential 2030, and a voltage source 2040 drive the Foster network 2010. A resistor series 2050 and a capacitor series 2060 provide interconnected parallel paths between the current source 2020 and the voltage source 2040, both of which connect to a ground potential 2070. The Foster network 2010 is adapted by equating the voltage output V(t) to the amplitude or phase. Where one circuit represents the normalized pulse amplitude and another circuit represents the phase. Experimentation determined that the amplitude transient response can be well represented by a two time-constant cascaded Foster network circuits. The phase behavior is more complex and requires up to three time-constant circuits. The transient curves can be numerically approximated by fitting them with the following exponential equations derived from the Foster network topology:

$$A_m[n] = -P_{1A}\exp\left(\frac{-(n-1)}{PRF}\frac{1}{t_{1A}}\right) - P_{2A}\exp\left(\frac{-(n-1)}{PRF}\frac{1}{t_{2A}}\right) + c_A, \quad (2)$$

$$\phi_m[n] = -P_{1\phi}\exp\left(\frac{-(n-1)}{PRF}\frac{1}{t_{1\phi}}\right) - P_{2\phi}\exp\left(\frac{-(n-1)}{PRF}\frac{1}{t_{2\phi}}\right) - P_{3\phi}\exp\left(\frac{-(n-1)}{PRF}\frac{1}{t_{3\phi}}\right) + c_\phi, \quad (3)$$

where $A_m[n]$ is the modeled transient amplitude (voltage gain) in volts and $\phi_m[n]$ is the corresponding phase in radians per second, for the $n^{th}$ pulse in the CPI, n=1, 2, 3, ... N. PRF is the current radar pulse repetition frequency. The time constants τ are on the order of dozens of microseconds to milliseconds. Variables P and c are respective functions of the preceding waveform's pulse width and duty cycle.

Multifunction waveform fitting: MATLAB was used to numerically solve eqns. (5) and (6) for the amplitude and phase transients shown in FIGS. 16 and 17. The amplitude transient expressed in volts has parameters $P_{1a}$=4.6 millivolts, $P_{2a}$=7.1 millivolts, and $c_a$=988.3 millivolts; the time constants were $\tau_{1a}$=0.261 milliseconds and $\tau_{2a}$=1.88 milliseconds. The phase transient expressed in radians per second has parameters $P_{1\phi}$=−16.3 mrad/s, $P_{2\phi}$=−46.8 mrad/s, $P_{3\phi}$=−48.4 mrad/s, and $c_\phi$=101.6 mrad/s; the time constants were $\tau_{1\phi}$=0.061 milliseconds, $\tau_{2\phi}$=0.341 milliseconds and $\tau_{3\phi}$=1.47 milli-seconds. The resulting NMSE for the data fit was −81 dB for amplitude and −57 dB for phase; signifying an excellent fit. The model fit was compared to a new data set collected three days after the initial parameter fit. All of the conditions experienced by the amplifier during the original data capture were replicated during the new data capture. The NMSE for the new data capture was −73 dB for amplitude and −44 dB for phase. Although this represents a decrease in fitness, the fit is still excellent.

Figure 21:
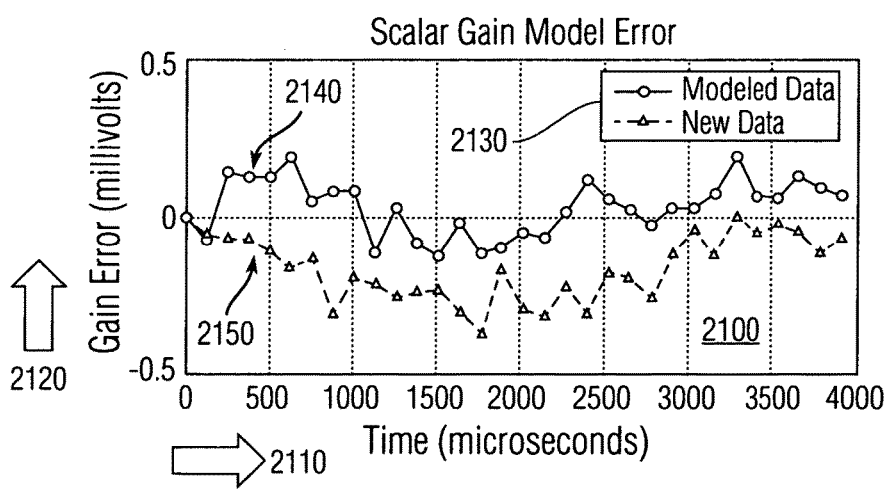
FIG. 21 is a graphical view of the behavioral model scalar gain error.
Figure 22:
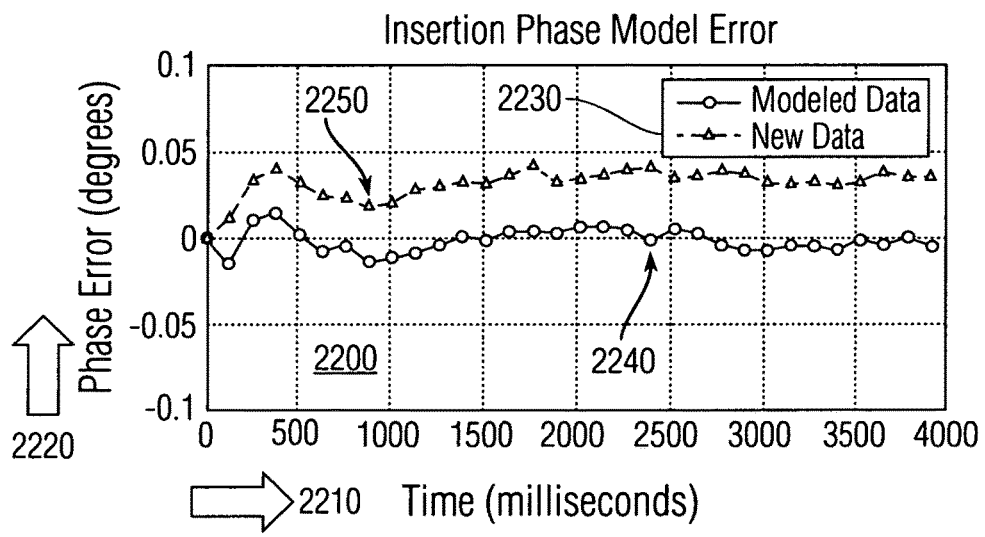
FIG. 22 is a graphical view of the behavioral model insertion phase error.

FIGS. 21 and 22 show the error between the measured amplitude and phase transients and the models. FIG. 21 shows a plot view 2100 of scalar gain model error. The abscissa 2110 denotes time in microseconds (μs), while the ordinate 2120 denotes gain error in millivolts (mV). A legend 2130 identifies modeled and new data. The filled circles 2140 identify modeled data, while the filled triangles 2150 identify new data. FIG. 22 shows a plot view 2200 of insertion phase model error. The abscissa 2210 denotes time in microseconds (μs), while the ordinate 2220 denotes phase error in degrees. A legend 2230 identifies modeled and new data. The filled circles 2240 identify modeled data, while the filled triangles 2250 identify new data. The errors are shaped (systematic); the residue is due to noise and a less than perfect representation of the transient. However, increased model complexity is not required, as demonstrated next.

A small error is desirable in order to use the model as part of a pre-distortion algorithm. MTI and Doppler radars are highly sensitive to pulse-to-pulse stability. Section VII discusses the radar system stability requirements used as an example in this disclosure, a summary is provided here for narrative. The requirements call for a difference in complex gain, between consecutive pulses, smaller than 0.007 dBc and phase shift smaller than 0.091°. Assuming a perfect pre-distortion implementation, the gain error in FIG. 21 shows the difference between consecutive pulses to be at a maximum of approximately 0.2 millivolts, or 0.002 dBc. The phase error in FIG. 22 shows the differences between consecutive pulses to be at a maximum of approximately 0.026°. This indicates that the model is adequate for use in pre-distortion as a mechanism to mitigate the amplitude and phase transients. However, the device's AM/AM and AM/PM conversions are significant and need to be considered, this is discussed in Section VIII, with AM being amplitude modulation and PM being phase modulation This same process was repeated for several different preceding waveforms (CPI 2 630), forced to last 20 milliseconds. Several combinations of duty cycles (2%, 8%, 10%, 15% and 20%) and pulse widths (1, 8, 10, 20, 30, 40, 50 microseconds) were used. The resulting parameters are not shown in this disclosure. However, dependencies regarding pulse width and duty cycle were observed. These parameters were stored in a lookup table, where a simple interpolation can be used to estimate parameters within the dimensional space of pulse width and duty cycle.

Section VII—As previously explained, the observed amplitude and phase transients are detrimental to radar system performance. This disclosure proposes the use of an MTI single pulse canceller and a root mean square (RMS) P2P method as the performance metrics for evaluating the severity of the transients and for determining the effectiveness of pre-distortion implementation. These two metrics are used to visualize difference aspect of the observed transients. The MTI method is helpful in characterizing the stability of adjacent pulses. The RMS P2P method is helpful in assessing the effect of individual pulses in the overall waveform (CPI) stability.

MTI instability limitation equations for pulse amplitude and transmitter phase shift are used to calculate the clutter improvement limitations. These equations are combined into vector form:

$$I[n] = -20 \log_{10}(|A[n]e^{i\phi[n]} - A[n-1]e^{i\phi[n-1]}|) \quad (4)$$

where I is the MTI improvement factor (or cancellation ratio) of two adjacent pulses, n is the index of the pulse within a CPI, A is the average amplitude (volts), and $\phi$ is the average phase (radians per second) of the $n^{th}$ pulse in a CPI. The smaller the instabilities, the larger the improvement factor and thus the better the radar will perform in cancelling stationary clutter. The actual improvement factor depends on many system-specific parameters. This disclosure assigns a goal of 53 dB improvement factor, being typical of the improvement factor achievable by air surveillance radar with rotating antennas. Limitations in the improvement factor are calculated in eqn. (4) resulting from the observed amplitude and phase transients shown in FIGS. 16 and 17, with the results shown in FIG. 23.

Figure 23:
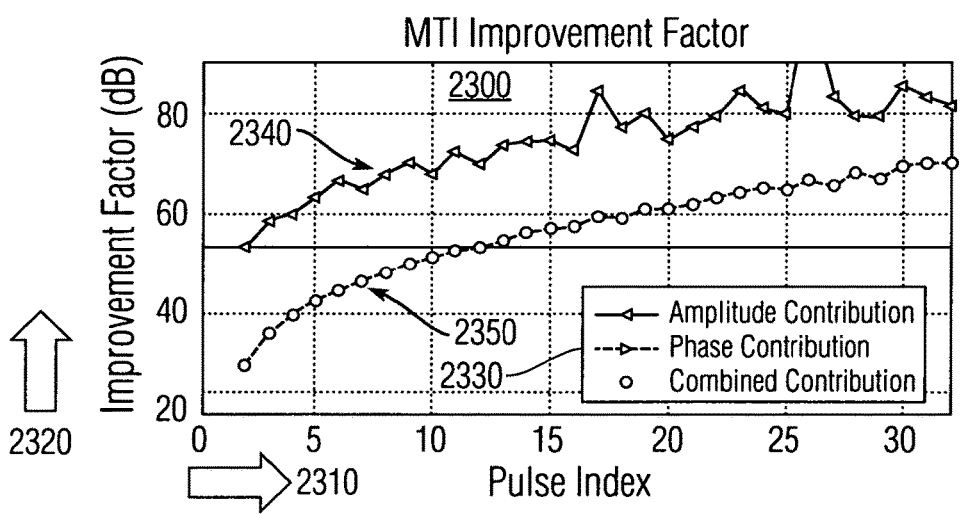
FIG. 23 is a graphical view of an MTI improvement factor comparison (before pre-distortion)

FIG. 23 shows a plot view 2300 of MTI improvement factor for the isolated amplitude and phase transients. To achieve an improvement factor of 53 dB, the interpulse amplitude stability and phase stability must be better than 0.007 dBc and 0.091° respectively. The improvement factor falls short of the requirement early in the CPI due to the transient effect, but increases over time as the memory effect is diminished. The isolated amplitude transient has a small effect on the intrapulse instability, yielding a high improvement factor. The abscissa 2310 denotes pulse index (integers), while the ordinate 2320 denotes improvement factor in decibels (dB). A legend 2330 identifies contribution. The filled diamonds 2340 identify the amplitude contribution, while the filled triangles 2350 identify the phase contribution, and the filled circles denote combined contribution. The phase instability is two orders of magnitude worse than the amplitude instability. Thus, the phase instability is the major contributor to the instability and essentially coincides with the combined contribution.

The MTI improvement factor method quantifies the difference between adjacent pulses, shown in FIG. 23 in graphical form. The transient perturbation produced by the previous waveform is seen as progressively reducing, thus increasing the improvement factor over time. The ultimate achievable MTI improvement factor is limited by the available SNR, to an average value of SNR −2 dB. In this instance, the approximated SNR using the DFT method is 83 dB, limiting the improvement factor to an average value of 81 dB.

Another important metric used to evaluate the pulse-to-pulse stability of radar system is referred to as the root mean square (RMS). In this method, the stability is calculated from the mean square error between successive pulses in a CPI (or pulse train burst). Similar to the previously described MTI improvement factor, the RMS method quantifies variations between consecutive pulses of a pulse train. However, there are three main differences:

1) Whereas in the MTI method, the pulses are pulse-compressed following conventional radar processing techniques, the RMS method compares the entire pulse envelop.
2) On the MTI method the stability for each consecutive pulse-pair is quantified separately, but on the RMS method the results is a combination of all of the pulses in the CPI.
3) The RMS method does not benefits from the pulse compression processing gain, and thus requires additional data averaging to improve the SNR and ensure that the amplifier stability due to the transients is observable and not limited by noise.

The equations for pulse-to-pulse amplitude and phase stability are below as amplitude stability in dB:

$$S_A = -10 \cdot \log_{10} \frac{\frac{1}{N-1} \sum_{j=1}^{N-1} (X_{j+1} - X_j)^2}{\overline{X}^2}, \quad (5)$$

$$\text{and } \overline{X} = \frac{1}{N} \sum_{j=1}^{N-1} X_j. \quad (6)$$

Figure 24:
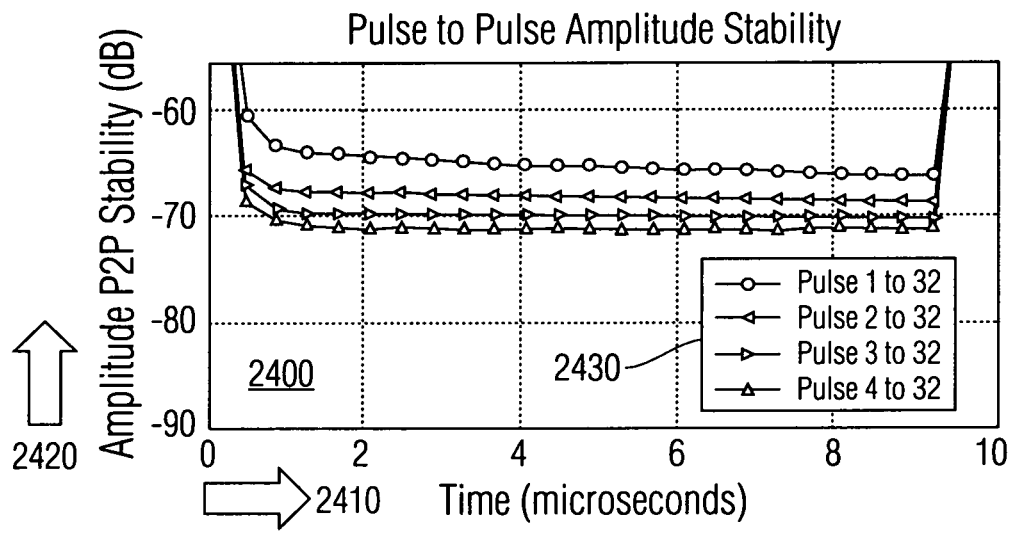
FIG. 24 is a graphical view of amplitude stability (before pre-distortion)
Figure 25:
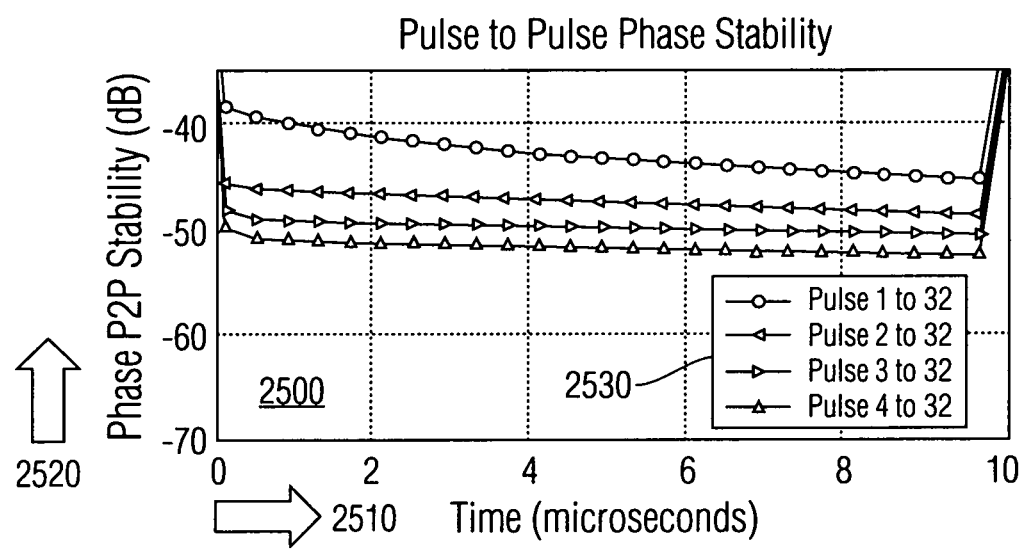
FIG. 25 is a graphical view of phase stability (before pre-distortion)

Phase stability in dB is provided by:

$$S_\Phi = -10 \cdot \log_{10} \left( \frac{1}{N-1} \sum_{j=1}^{N-1} (\Phi_{j-1} - \Phi_j)^2 \right), \quad (7)$$

where, $X_j$ is the pulse amplitude envelope, $\overline{X}$ is the average of all the pulses in a pulse train burst with N pulses, and $\Phi_j$ is the pulse phase envelope. FIGS. 24 and 25 show the pulse-to-pulse stability for amplitude and phase respectively for N=32. FIG. 24 shows a plot view 2400 of amplitude stability between pulses. The abscissa 2410 denotes time in microseconds (µs), while the ordinate 2420 denotes amplitude P2P stability in decibels (dB). A legend 2430 identifies pulse sequences: 1-to-32, 2-to-32, 3-to-32 and so forth. FIG. 25 shows a plot view 2500 of phase stability between pulses. The abscissa 2510 denotes time in µs, while the ordinate 2520 denotes phase P2P stability in dB. A legend 2530 identifies pulse sequences: 1-to-32, 2-to-32 and so forth.

The pulse-to-pulse stability is significantly influenced by the earlier pulse in the CPI. This is confirmed by removing the leading pulses from the stability calculation. FIG. 24 shows that on average, the amplitude P2P stability for all pulses is −65.1 dB. Removal of the first through third pulses from the calculation improves the stability to −68.1 dB, then subsequently to −69.8 dB and finally to −71.2 dB. FIG. 25 shows that on average the phase P2P stability for all pulses is −42.8 dB. Removal of the first three pulses from the calculation improves the stability to −47.4 dB, then to −49.8 dB and finally to −51.8 dB. The P2P stability improves as the leading pulses are removed from the calculation, indicating that earlier pulses have greater variations from the mean. The deviation from a flat line observed in the curve "pulse 1-to-32" indicates intrapulse distortion in relation to the mean for the first pulses.

Figure 26:
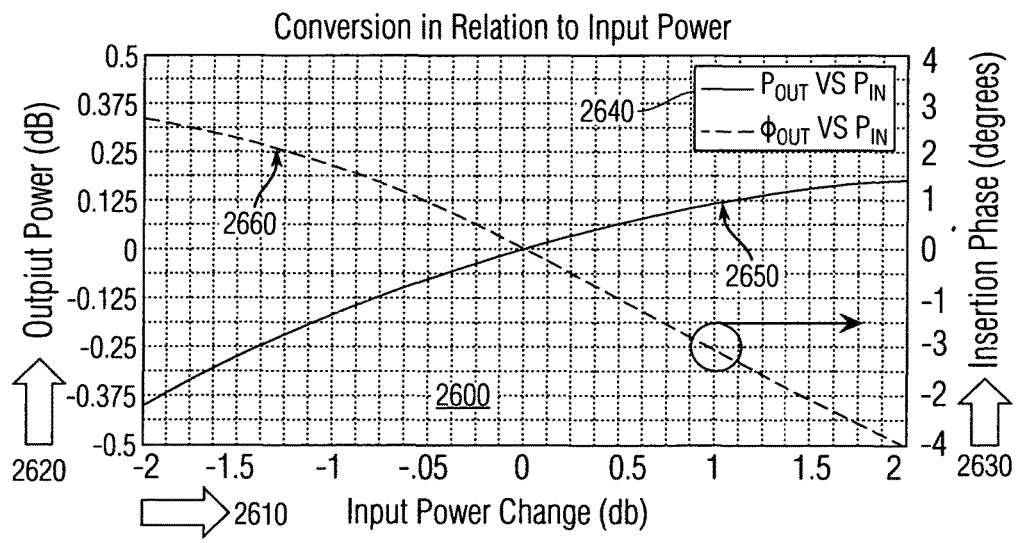
FIG. 26 is a graphical view of conversion relation to input power (AM to AM conversion)

Section VIII—The limitation in MTI improvement factor is dominated by the phase transient. The improvement factor can be increased significantly (by more than 10 dB) by correcting for the presence of the phase transient with the use of pre-distortion. The limitation in improvement factor imposed by the amplitude transient exceeds the 53 dB goal, and it may not be necessary to correct with pre-distortion. Correcting for the amplitude transient is complicated by the strong nonlinearity of the DUT 370. This nonlinearity can be observed as significant AM/AM and AM/PM conversion. FIG. 26 shows a plot view 2600 of conversion curves relative to nominal operation at maximum efficiency. The AM/AM and AM/PM conversion curves are shown relative to the nominal operating point of maximum efficiency. The abscissa 2610 denotes input power change in decibels (dB), while the left ordinate 2620 denotes output power in dB and the right ordinate 2630 denotes insertion phase in degrees. A legend 2640 identifies the lines: solid line 2650 for output power versus input power as AM/AM, and dash line 2660 for output phase versus input power as AM/PM (found to be AM/AM=0.19 dB/dB and AM/PM=−1.06°/dB). The AM/AM and AM/PM conversion curves are shown relative to the nominal operating point of maximum efficiency.) The input power was swept ±2 dB and the output power and insertion phase was measured. The solid line 2650 shows the output power versus the input power, illustrating the AM/AM conversion. The dash line 2660 shows the insertion phase versus input power, illustrating the AM/PM conversion. Any benefits of implementing AM pre-distortion to compensate for the amplitude transient contribution can be offset by the complications imposed upon the PM pre-distortion. However, to demonstrate the pre-distortion concept, both amplitude and phase pre-distortion are implemented, along with appropriate AM/AM and AM/PM compensation. In this disclosure, amplitude and phase pre-distortion are implemented to mitigate effects that transients have on radar performance.

Figure 27:
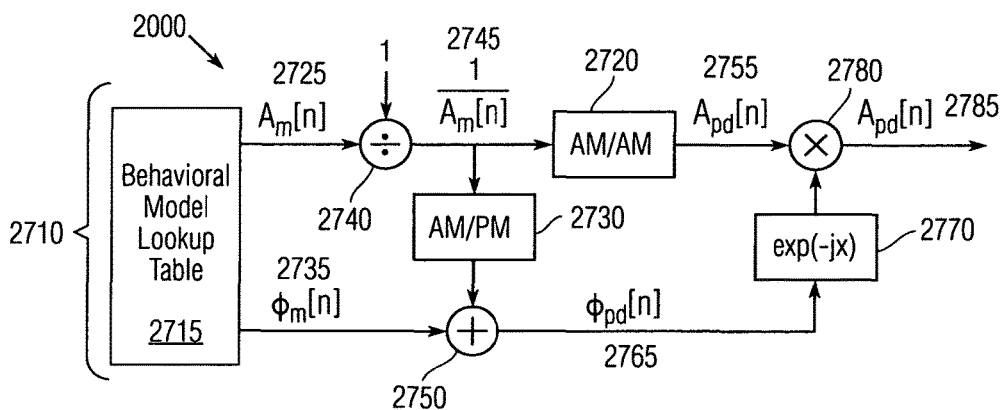
FIG. 27 is a block diagram view of the pre-distortion process.

The pre-distortion implementation is conceptually simple. FIG. 27 shows a block diagram view 2700 of the pre-distortion algorithm process 2710 with a behavioral model lookup table 2715 that provides inputs. The process 2710 provides an AM/AM polynomial processor 2720 that receives the inverse 2740 of the amplitude data 2725 from the table 2715, and an AM/PM polynomial processor 2730. The table 2715 also provides phase data 2735. An inverter 2740 receives the amplitude data 2725 to produce reciprocal amplitude data 2745 for input to the AM/AM polynomial processor 2720 and the AM/PM polynomial processor 2730. A summation processor 2750 receives the phase data 2735 and results from the AM/PM polynomial processor 2730. The AM/AM polynomial processor 2720 provides amplitude coefficient $A_{pd}$ 2755 describing the desired input power change to the amplifier amplitude data. The summation processor 2750 provides the phase coefficient $\phi_{pd}$ 2765 that feeds to an exp(−jx) processor 2770, where j=√−1 represents the imaginary unit for complex values. The amplitude coefficient 2755 and the product of the processor 2770 are multiplied 2780 yielding voltage result 2785. The voltage 2785 is a complex vector whose values contain the required corrections in amplitude and phase to counteract the amplitude and phase transient. The developed model was used to calculate the inverse of the amplitude and phase transients. Conversion compensation for AM/AM and AM/PM is applied to these coefficients before the desired amplitude and phase shift is imparted into the waveforms. Each coefficient was applied to individual pulses in the CPI. In this example both AM/AM and AM/PM conversion are approximated by second order polynomials. These pulses were then fed to the DUT 370, following the multifunction sequence previously described.

The inverse amplitude transient coefficients with AM/AM compensation are found by:

$$A_{pd}[n] = f_{AM/FM}\left(\frac{1}{A_m[n]}\right), \tag{8}$$

where, $A_{pd}$ is the amplitude pre-distortion coefficient for the $n^{th}$ pulse in the CPI. $A_m$ is the modeled (or measured) amplifier response. The function $f_{AM/AM}(x)$ is a polynomial of second order that describes the AM/AM conversion, where x is the output power and $f_{AM/AM}$ returns the input power. Coefficient $A_{pd}$ represents the desired input power change to the amplifier that remains a constant output power from pulse-to-pulse. The negative phase transient coefficients with AM/PM compensation are found by:

$$\phi_{pd}[n] = \phi_m[n] + f_{AM/FM}\left(\frac{1}{A_m[n]}\right), \tag{9}$$

where, $\phi_{pd}$ is the phase pre-distortion coefficient for the $n^{th}$ pulse in the CPI. The function $f_{AM/PM}(x)$ is a polynomial of second order that describes the AM/PM conversion where X is the output power and $f_{AM/PM}$ returns the amplifier insertion phase. The value $-\phi_{pd}$ represents the desired input phase shift to the amplifier that will maintain a coherent phase from pulse-to-pulse. These two arrays are combined to form a complex number vector:

$$V_{pd}[n]=A_{pd}n]e^{-j\phi_{pd}[n]}=A_{pd}n]\exp(-j\phi_{pd}n]), \tag{10}$$

where $V_{pd}$ is a vector containing n complex numbers. The vector $V_{pd}$ is then used during waveform synthesis, producing pulses within a CPI that differ from one to another.

The amplitude and phase of each individual pulse in the CPI was altered to counteract the time-varying DUT's gain change and insertion phase change. These combine resulting in a constant coherent output in reference to the radar's master oscillator. The pre-distortion technique does not directly alter the shape of the output pulses in the CPI, but rather changes the mean value of the amplitude and phase at the input of the amplifier. This counteracts the transient effects introduced by the amplifier. The following paragraphs further explain this concept.

Figure 28:
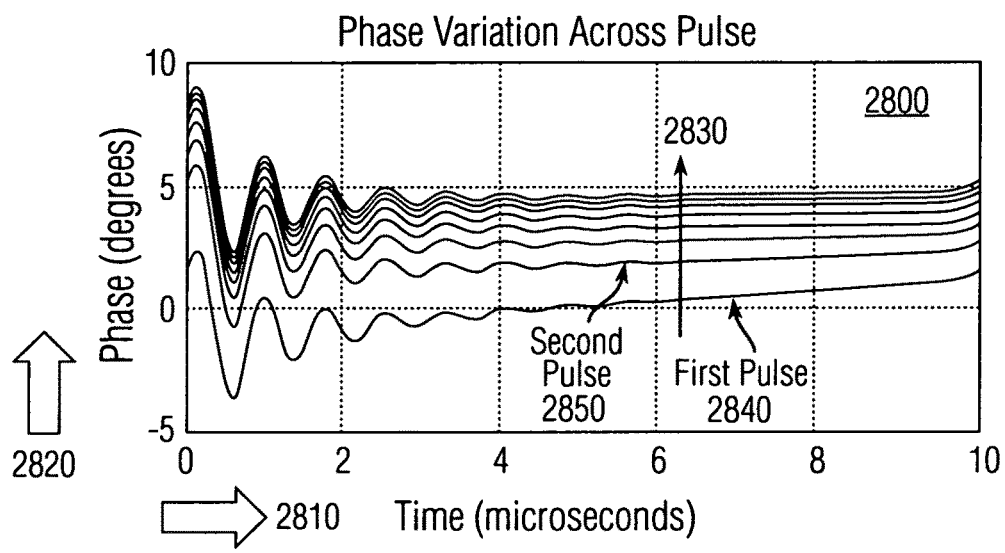
FIG. 28 is a graphical view of amplitude variation across pulses (before pre-distortion)
Figure 29:
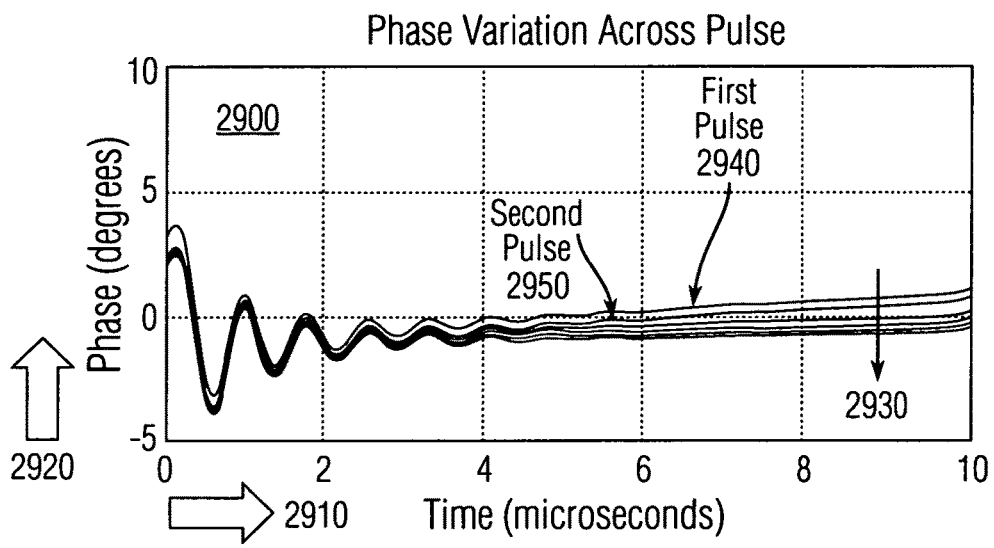
FIG. 29 is a graphical view of phase variation across pulses (after pre-distortion)

FIG. 28 shows a plot view 2800 of the pulse phase envelope for several consecutive pulses in CPI 1 530, during a multifunction sequence 600, before pre-distortion. The abscissa 2810 denotes time in microseconds (µs), while the ordinate 2820 denotes phase in degrees. A trend line 2830 identifies sequential pulses from first pulse line 2840, second pulse line 2850 and so forth. Each of the pulses shown has a different phase, which corresponds to the phase shift transient described in FIG. 17. The pre-distortion counteracts this dispersal by applying a negative phase shift to each pulse in the CPI. FIG. 29 shows a plot view 2900 of the effect of pre-distortion in the pulse phase envelope for several pulses in CPI. The abscissa 2910 denotes time in µs, while the ordinate 2720 denotes phase in degrees. A trend line 2930 identifies sequential pulses from the first pulse line 2940, second pulse line 2950 and so forth. The pre-distortion succeeds in reducing differences between the pulses, by making the average phase for each pulse equal as compared to a coherent reference. The same concept applied to the amplitude transient, where the average output power for each pulse becomes constant.

Figure 30:
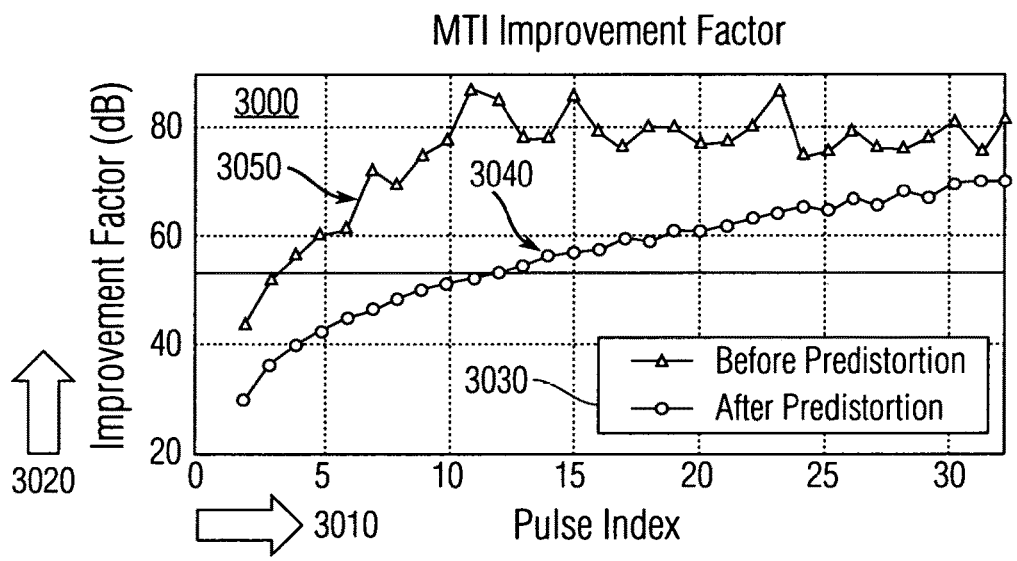
FIG. 30 is a graphical view of MTI improvement factor comparing the before and after pre-distortion performance.

Manufacturing variability in each amplifier can result in slightly different behavior across a large number of devices, which is supported by results. This may require a unique set of coefficients per amplifier, depending on the improvement factor sought. Visualizing the mitigation of memory effects by pre-distortion can be facilitated by examining the MTI improvement factor and determining whether or not it is possible to achieve overall system stability. The MTI improvement factor before and after pre-distortion is shown in FIG. 30 as a plot view 3000. The abscissa 3010 denotes pulse index in the CPI as integers, while the ordinate 3020 denotes the improvement factor in decibels (dB). A legend 3030 identifies the pre-distortion status: solid circles 3040 denote without pre-distortion and solid triangles 3050 denote with pre-distortion. The transients have been reduced significantly; this enables the improvement factor to reach a higher level quicker. The difference between the before and after pre-distortion is approximately 13 dB for the first two pulses, and 17 dB for the next few pulses.

Figure 31:
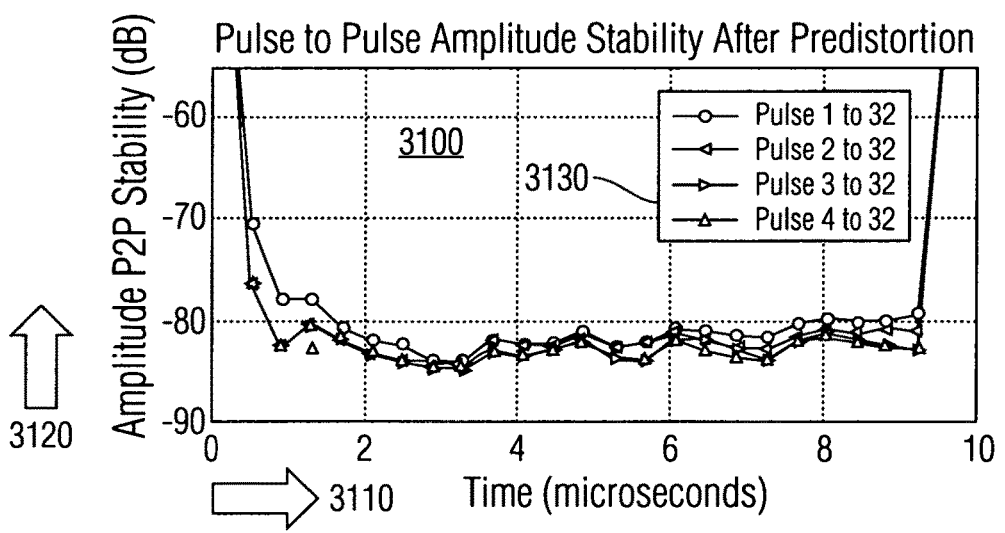
FIG. 31 is a graphical view of pulse-to-pulse amplitude stability after pre-distortion.
Figure 32:
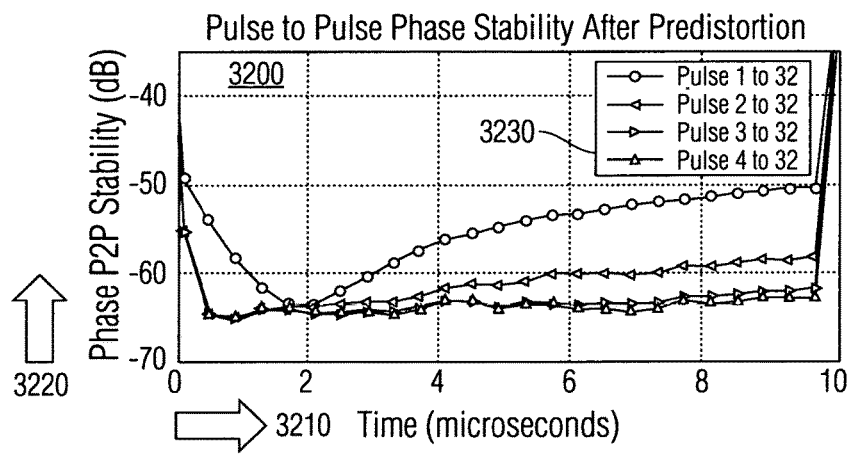
FIG. 32 is a graphical view of pulse-to-pulse phase stability after pre-distortion.

FIGS. 31 and 32 show effects of pre-distortion on the pulse-to-pulse stability for amplitude and phase respectively for N=32. FIG. 31 shows a plot view 3100 of the P2P amplitude stability. The abscissa 3110 denotes time in microseconds (µs), while the ordinate 3120 denotes amplitude P2P stability in decibels (dB). A legend 3130 identifies pulse sequences: 1-to-32, 2-to-32, 3-to-32 and so forth. On average, the stability for all pulses is −80 dB, remaining at that value even after other leading pulses are removed from the calculation. This suggests a limit in the available SNR for the data set. Before pre-distortion, the P2P amplitude stability for all pulses was −65.1 dB. This is a significant improvement of at least 14 dB. FIG. 32 shows a plot view 3200 of the P2P phase stability. The abscissa 3210 denotes time in µs, while the ordinate 3220 denotes P2P phase stability in decibels (dB). A legend 3230 identifies pulse sequences: 1-to-32, 2-to-32, 3-to-32 and so forth. The phase P2P stability for all pulses is on average −54.5 dB. Removal of the first three pulses from the calculation improves the phase stability to −61.1 dB, then to −63.6 dB and finally to −63.9 dB. The P2P phase stability improved by at least 11 dB.

After pre-distortion, the RMS P2P method suggests that the first two pulses are the limiting factor in achieving better stability. In FIG. 30, the curve "Pulse 1-to-32" shows a large discrepancy from the rest of the curves. This denotes that the shape of the first pulse has large variations from the mean pulse in the sequence. The stability reaches a minimum at approximately two milliseconds. The phase envelope for all of the pulses coincides at that time. This corresponds to the pre-distortion mechanism, where each pulse at the output of the amplifier has equal average amplitude and phase.

The MTI improvement factor and RMS P2P Stability metrics demonstrate that the proposed pre-distortion technique can mitigate the transient instability produced by the GaN when they are excited with multifunction waveforms. An improvement over stability in the order of 13 dB to 18 dB was achieved. This stands for a significant improvement over waiting until the transient diminishes, and directly translates into a significant savings of time and energy. For instance, before pre-distortion, the radar achieved the desired stability after completion of the eleventh and twelfth pulses, as the first ten pulses did not satisfy stability requirements. After pre-distortion, the radar achieved the desired stability after completion of the third and fourth pulses, while the first two pulses did not satisfy stability requirements. If for example, sixteen stable pulses are needed to detect a target in the presence of clutter; before pre-distortion twenty-six pulses need to be transmitted versus eighteen pulses if the exemplary pre-distortion is used. This represents a 31% reduction in time, and decrease in consumed energy for the given task.

Figure 33:
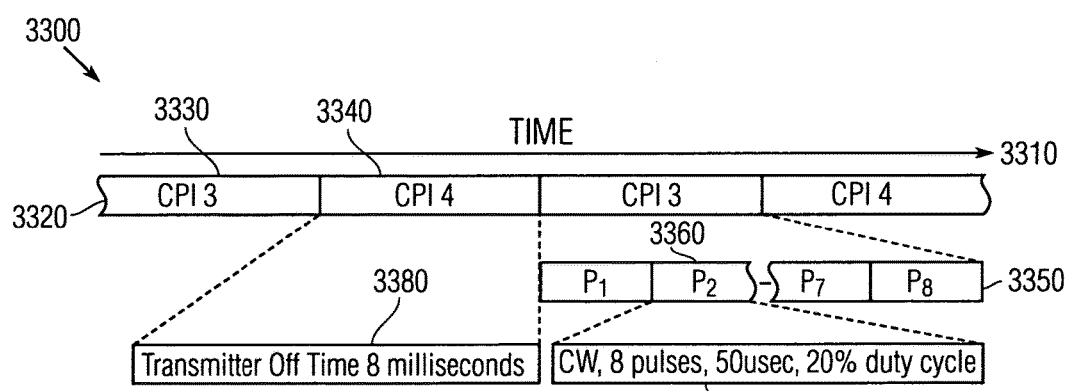
FIG. 33 is a sequence diagram view of a second multifunction sequence process timeline.

Section IX—Pulse Absence: The developed model and pre-distortion technique are also effective for the case where silence, instead of another pulsed waveform, is introduced in the sequence. A similar example was presented in Delprato. FIG. 33 shows a sequence diagram view 3300 of a third process timeline 3310, featuring a pulse train burst sequence 3320, where a radar waveform followed by a period of silence is fed to the DUT 370 in perpetuity. A multifunction sequence 3320 includes CPI 3 3330 and CPI 4 3340. The CPI 3 3330 includes a pulse sequence 3350 of eight pulses having parameters $P_1, P_2, \ldots P_7, P_8$. The pulse parameter $P_2$ 3360 of the sequence 3350 includes characteristics 3370 of being continuous wave (CW) of eight pulses, each having 50 µs pulse in a duration of a 20% duty cycle (DC). The CPI 4 3340 is an eight-millisecond-period without transmission of any signal. The properties of the pulse train burst sequence 3320 are such that lead to two extreme conditions. The first is a relatively long off period where the DUT 370 is dissipating very little heat; in essence being disabled. Due to the GaN architecture 750 and the high thermal conductivity of the SiC layer 740, the DUT 370 cools down quickly potentially reaching a state that resembles a cold start. The second condition is a relatively long pulse and a relatively large duty cycle, which represent a high operating temperature. The combination of a long off-time and long on-time causes significant temperature difference in between these two states, producing intrapulse distortion as well as interpulse instabilities.

Figure 34:
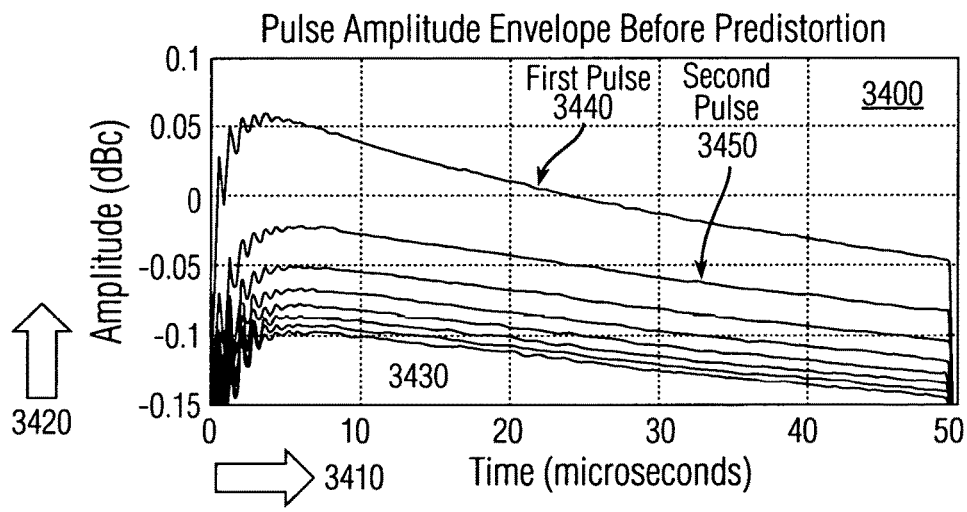
FIG. 34 is a graphical view of pulse amplitude before pre-distortion.
Figure 35:
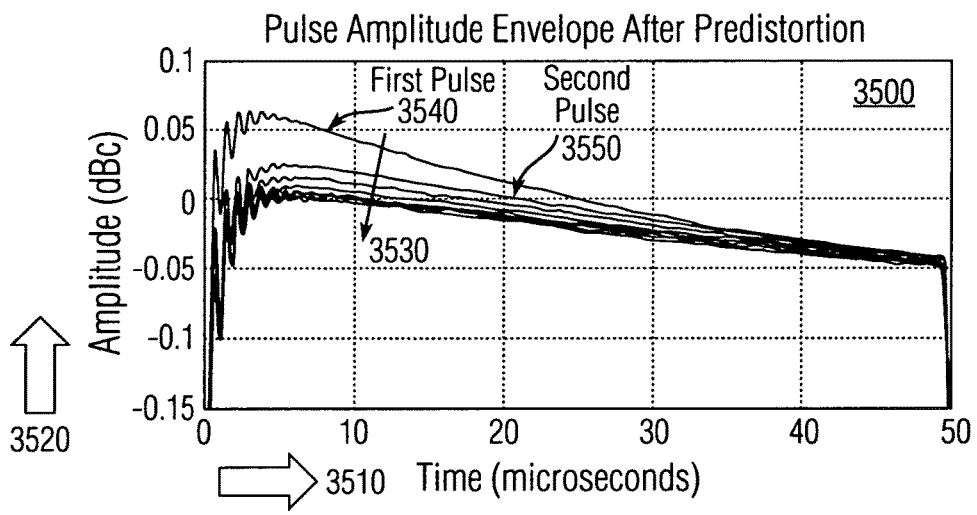
FIG. 35 is a graphical view of pulse amplitude after pre-distortion.

For this example, the same procedure was repeated for the new waveform sequence described in view 3300. The results contrast the before and after pre-distortion transients and stability as characterized by the amplitude and phase transients, MTI improvement factor and the RMS P2P stability methods. FIG. 34 shows a plot view 3400 of the amplitude envelope before pre-distortion. The abscissa 3410 denotes time in microseconds (µs), while the ordinate 3420 denotes amplitude change in decibels-carrier (dBc). A trend line 3430 identifies sequential pulses from first pulse line 3440, second pulse line 3450 and so forth. The pre-distortion counteracts this dispersal by applying an inverse amplitude to each pulse in the CPI. There is a noticeable difference in the average amplitude between the first and second pulse, measured to be 0.045 dB. FIG. 35 shows a plot view 3500 of the amplitude envelope after pre-distortion. The abscissa 3510 denotes time in µs, while the ordinate 3520 denotes amplitude change in dBc. A trend line 3530 identifies sequential pulses from first pulse line 3540, second pulse line 3550 and so forth. In contrast to FIG. 34, the average amplitude for the first two pulses was reduced to 0.004 dB.

Figure 36:
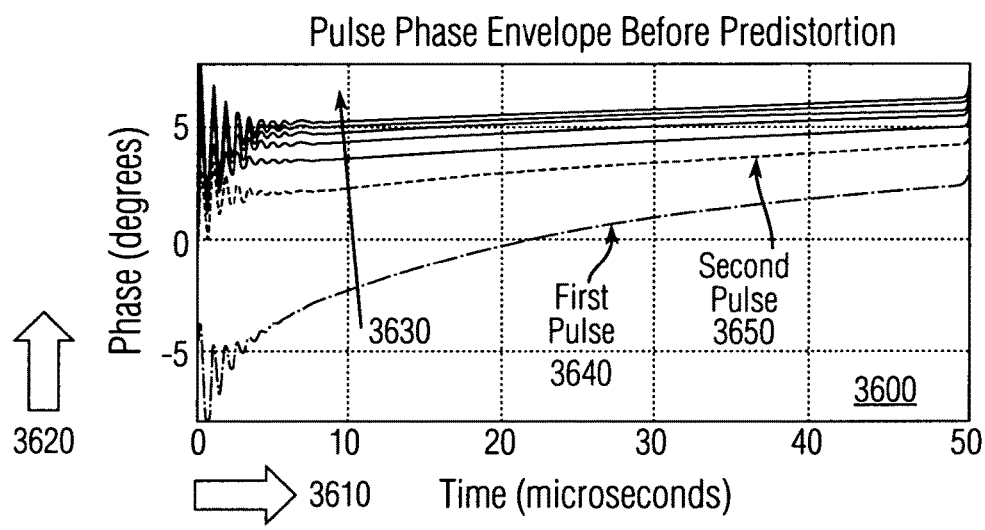
FIG. 36 is a graphical view of pulse phase envelope before pre-distortion.
Figure 37:
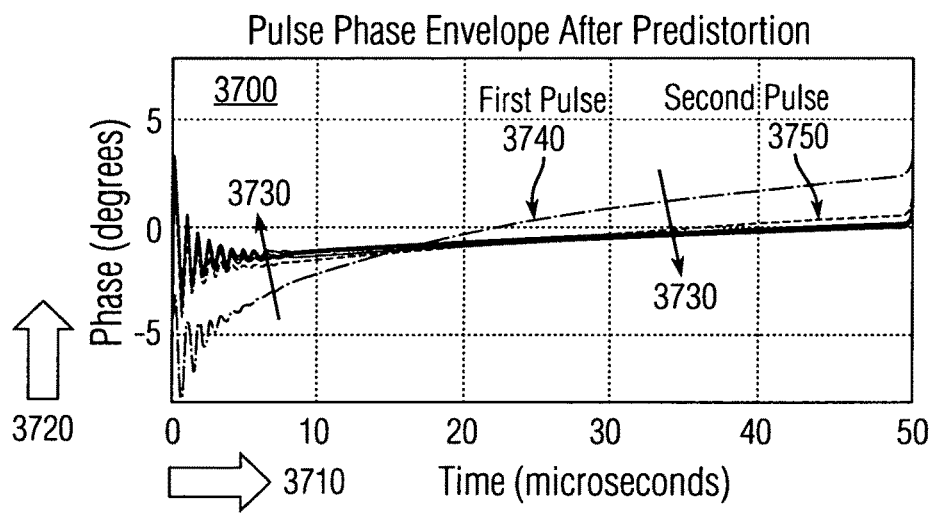
FIG. 37 is a graphical view of pulse phase envelope after pre-distortion.

FIG. 36 shows a plot view 3600 of the phase envelope before pre-distortion. The abscissa 3610 denotes time in microseconds (µs), while the ordinate 3620 denotes phase in degrees. A trend line 3630 identifies sequential pulses from first pulse line 3640, second pulse line 3650 and so forth. The difference in average phase between the first and second pulse was measured to be 3.4°. In addition, the shape of the first pulse line 3640 is different from the rest of the pulse train burst. FIG. 37 shows a plot view 3700 of the phase envelope after pre-distortion. The abscissa 3710 denotes time in microseconds (µs), while the ordinate 3720 denotes phase difference in degrees. A trend line 3730 identifies sequential pulses from first pulse line 3740, second pulse line 3750 and so forth. The average phase difference between the first and second pulse was reduced to 0.04°. The pulses shape was not changed; the first pulse line 3740 still has a shape that differs from the remaining pulses. This limits the RMS P2P phase stability.

Figure 38:
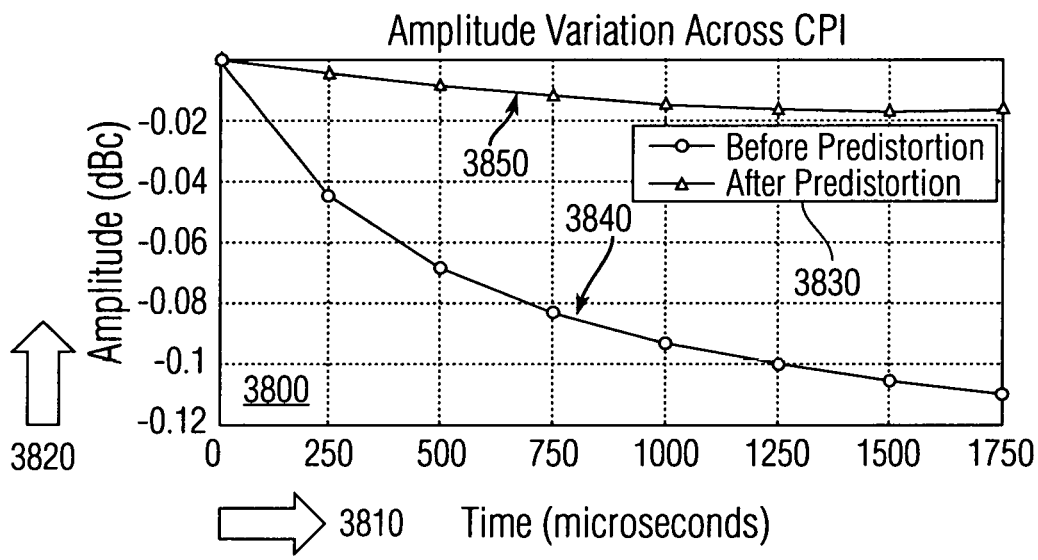
FIG. 38 is a graphical view of amplitude variation across a CPI before and after pre-distortion.
Figure 39:
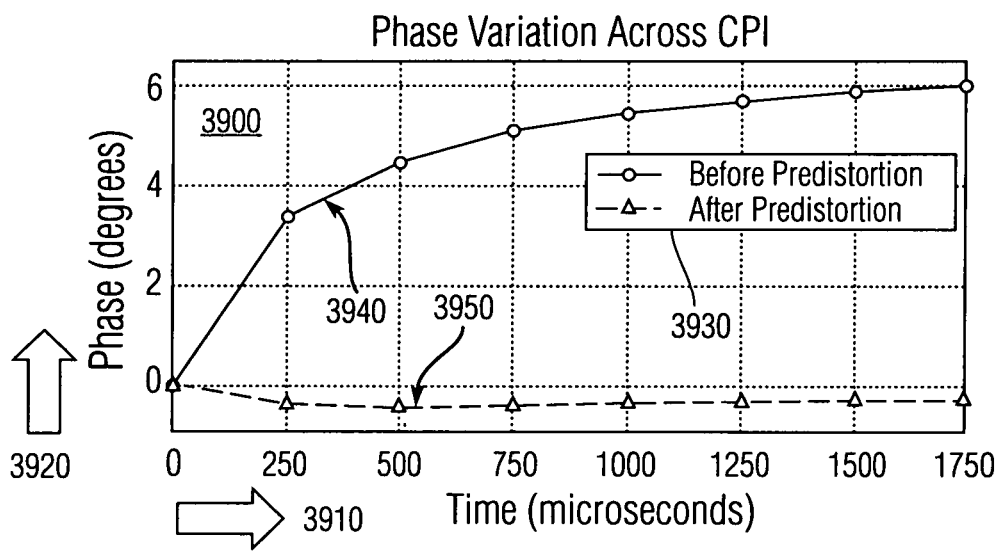
FIG. 39 is a graphical view of phase variation across a CPI before and after pre-distortion.

FIGS. 38 and 39 show effects of pre-distortion amplitude and phase transients. FIG. 38 shows a plot view 3800 of the amplitude transients for the new sequence, illustrating the amplitude variation before and after pre-distortion. The abscissa 3810 denotes time in µs, while the ordinate 3820 denotes amplitude difference in dBc. A legend 3830 identifies values before and after pre-distortion: the filled circles 3840 identify values before pre-distortion, while the filled triangles 3850 identify values after pre-distortion. The transient before pre-distortion shows a reduction in output power in excess of 0.1 dB. This is primarily caused by an increase in channel temperature. After exemplary pre-distortion, the output power fluctuates by less than 0.02 dB. The larger error as compared to the previous example is attributed to the characterization of the AM/AM and AM/PM conversion, performed by setting CPI 3 3930 in a continuous loops, thus the average channel temperature was higher than during the pulse train burst sequence 3320. FIG. 39 shows a plot view 3900 of the phase variation, with the initial phase transient reaching in excess of 6°. The abscissa 3910 denotes time in µs, while the ordinate 3920 denotes phase change in degrees. A legend 3930 identifies values before and after pre-distortion conditions: the filled circles 3940 identify values before pre-distortion, while the filled triangles 3950 identify values after pre-distortion. The phase only deviates by less than half-a-degree after application of exemplary pre-distortion. However, due to the poor AM/PM conversion characterization, the phase correction was overestimated.

Figure 40:
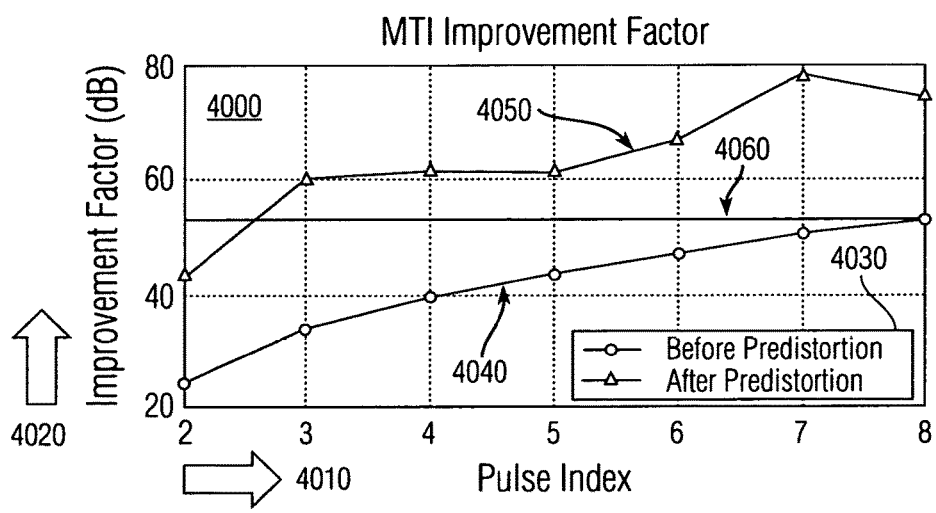
FIG. 40 is a graphical view of MTI improvement factor comparing the before and after pre-distortion performance.

FIG. 40 shows a plot view 4000 of the MTI improvement factor before and after pre-distortion. The abscissa 4010 denotes time in µs, while the ordinate 4020 denotes amplitude in dBc. A legend 4030 identifies sequential pulses: the filled circles 4040 identify values before pre-distortion, while the filled triangles 4050 identify values after pre-distortion. Acceptable performance is denoted by a 53 dB threshold improvement factor value 4060 as the minimum noted in Section VII. Before pre-distortion application, values 4040 reveal poor system performance, reaching the threshold value 4060 only after the eighth pulse was transmitted. The exemplary pre-distortion technique significantly enhances the improvement factor by 18.8 dB immediately after the second pulse, and exceeding 20 dB for the third pulse and cross the threshold value 4060.

Figure 41:
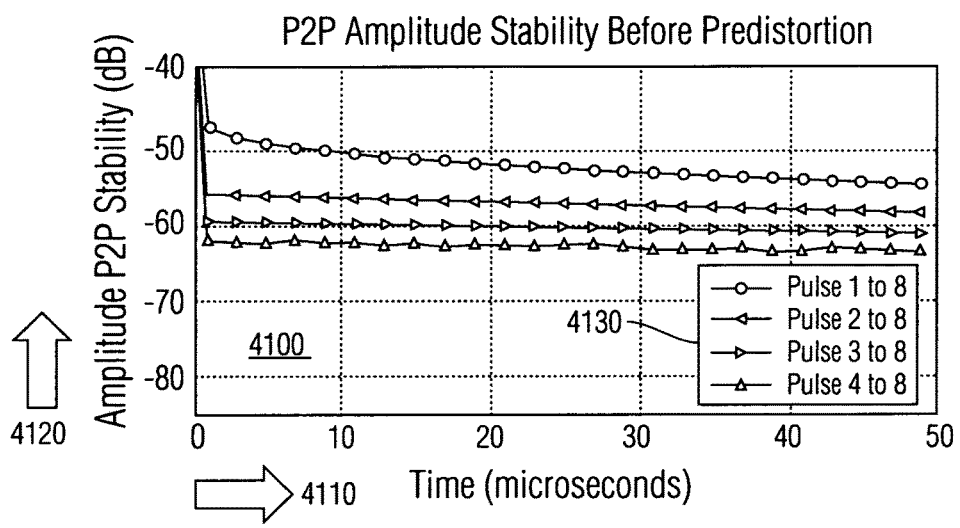
FIG. 41 is a graphical view of amplitude pulse-to-pulse stability before pre-distortion.
Figure 42:
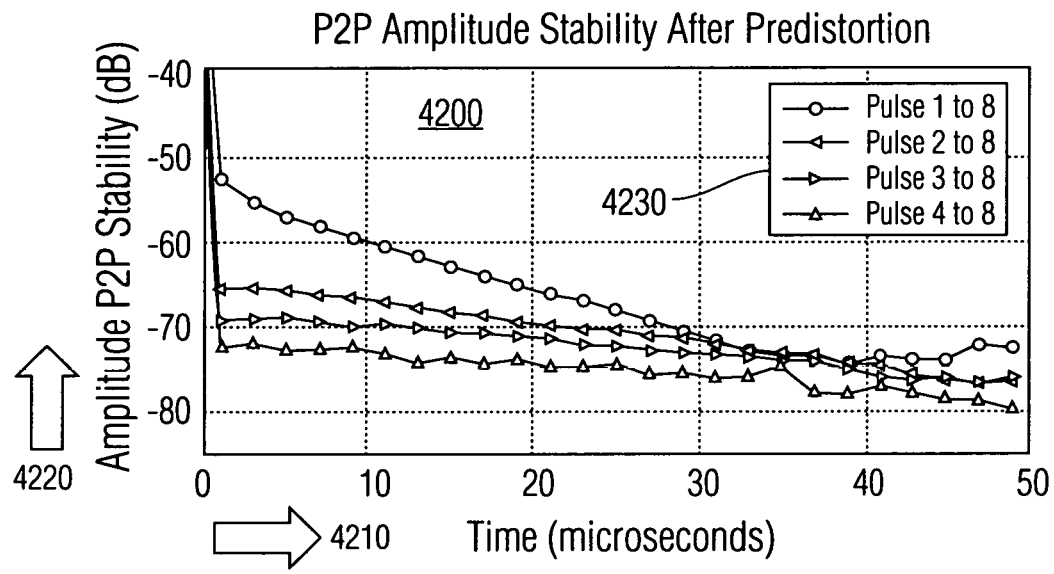
FIG. 42 is a graphical view of amplitude pulse-to-pulse stability after pre-distortion.

FIGS. 41 and 42 show effects of pre-distortion on the pulse-to-pulse amplitude stability for N=8. FIG. 41 shows a plot view 4100 of the RMS P2P amplitude stability before pre-distortion. The abscissa 4110 denotes time in µs, while the ordinate 4120 denotes amplitude in dBc. A legend 4130 identifies sequential pulses: 1-to-8, 2-to-8, 3-to-8 and so forth. Before pre-distortion, the average stabilities for pulses eliminating the first, second and third are −52.3 dB, −57.6 dB, −60.6 dB and −63.1 dB respectively. FIG. 42 shows a plot view 4200 of the RMS P2P amplitude stability after pre-distortion. The abscissa 4210 denotes time in µs, while the ordinate 4220 denotes amplitude in dBc. A legend 4230 identifies sequential pulses: 1-to-8, 2-to-8 and so forth. After pre-distortion, the similar average stability values are −63.4 dB, −69.5 dB, −71.6 dB and −74.6 dB, an improvement in stability of more than 10 dB.

Figure 43:
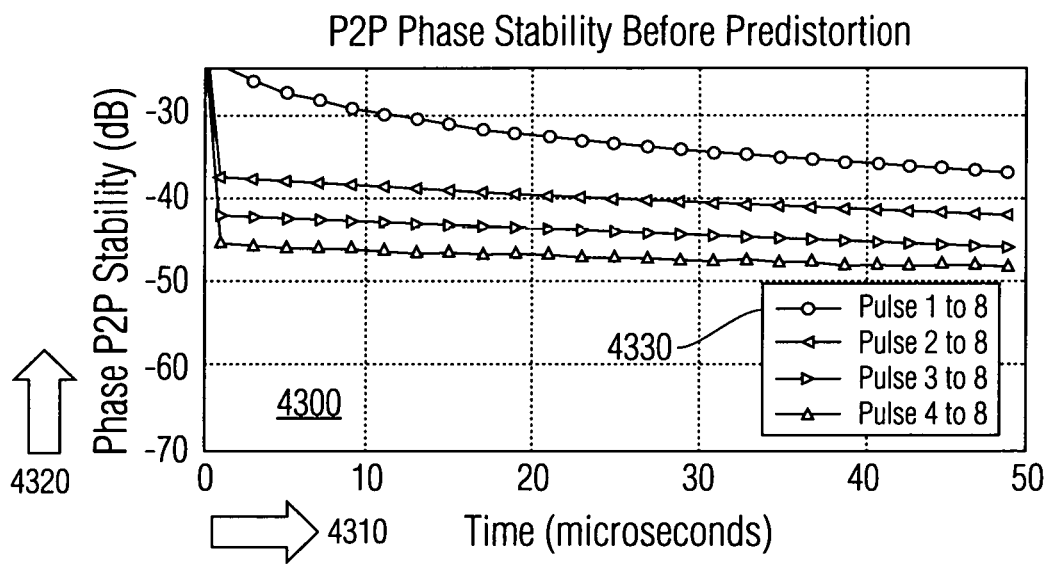
FIG. 43 is a graphical view of phase pulse-to-pulse stability before pre-distortion.
Figure 44:
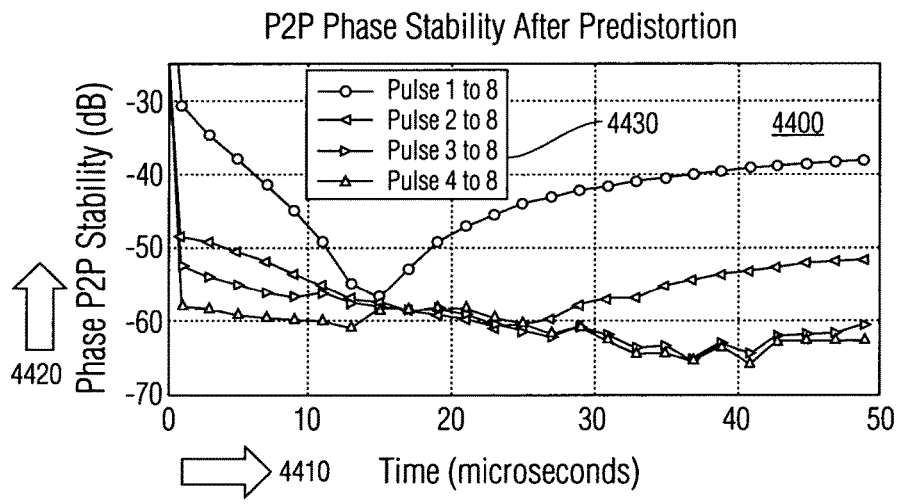
FIG. 44 is a graphical view of phase pulse-to-pulse stability after pre-distortion.

FIGS. 43 and 44 show effects of pre-distortion on the pulse-to-pulse phase stability for N=8. FIG. 43 shows a plot view 4300 of the RMS P2P phase stability before pre-distortion. The abscissa 4310 denotes time in microseconds (µs), while the ordinate 4320 denotes amplitude P2P stability in decibels (dB). A legend 4330 identifies pulse sequences: 1-to-8, 2-to-8, 3-to-8 and so forth. Before pre-distortion, the average stabilities for pulses eliminating the first, second and third are −32.3 dB, −40.2 dB, −44.2 dB and −47.2 dB respectively. FIG. 44 shows a plot view 4400 of the RMS P2P phase stability after pre-distortion. The abscissa 4410 denotes time in µs, while the ordinate 4420 denotes amplitude P2P stability in decibels (dB). A legend 4430 identifies pulse sequences: 1-to-8, 2-to-8, 3-to-8 and so forth. After pre-distortion, the similar average stability values are −41.6 dB, −54.7 dB, −59.1 dB and −60.7 dB: an improvement of 9 dB for the first pulse and approximately 14 dB for the subsequent pulses for exemplary pre-distortion in contrast to its absence. Even under the severe condition of transitions between cold and hot states, exemplified by the pulse train burst with long silence, the exemplary prediction technique improves the stability by at least 10 dB. This is a significant advantage over doing nothing, or a significant save in time if waiting until the transients subside.

Figure 45:
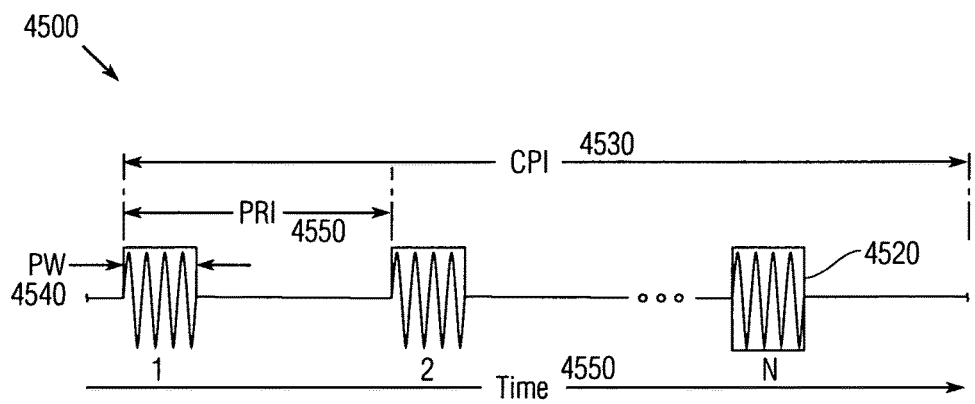
FIG. 45 is a timeline diagram view of a pulse sequence.

Section X—Waveform Library: The information required to construct the waveforms is stored in a Waveform Library File (WLF). The WLF contains a list of the waveforms to be synthesized during a test event. The number of entries in the waveform file is arbitrary, but should be kept small to conserve system resources and reduce the number of possible waveform combination while conducting an experiment. Each waveform must have a unique waveform name, and have independent and arbitrary values for the following properties: Pulse Modulation, Modulation Bandwidth, Pulse Width (PW), Pulse Duty Cycle and Number of Pulses in a waveform. The combined time for all pulses in a waveform is known as the Coherent Processing Interval (CPI), also known as dwell time. The CPI is a group of pulses used to extract information about a target. FIG. 45 shows a timeline view 4500 of hypothetical waveform along a timeline 4510 containing N pulses 4520 for constructing a CPI 4530. Ideally, each pulse has identical properties of PW 4540, duty cycle and modulation, thereby specifying the number of times a pulse is repeated to complete a radar's CPI 4530. Each pulse has uniform duration PW 4540, the spacing between pulse edges is the pulse repetition interval (PRI) 4550. At any time during normal radar operations, only individual pulses are transmitted. There are no other signals being transmitted in between pulses. Multiple pulses of identical characteristics are transmitted consecutively.

Figure 46:
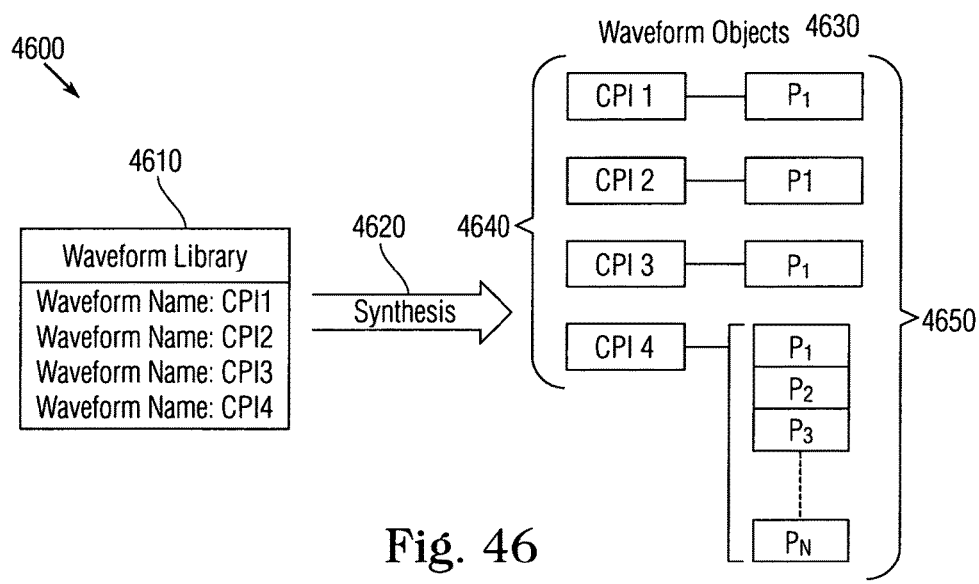
FIG. 46 is a block diagram view of a waveform library and related objects.

To study the effect of one waveform on another, the concept of Waveform of Interest (WOI) is introduced. This waveform is treated separately from all other waveforms, and is the only one collected for analysis. Due to the envisioned pre-distortion algorithm, this waveform synthesis requires the creation of all of the pulses in the waveform, instead of repeating an identical pulse. This enables the pre-distortion of each individual pulse in a waveform. This also means that reproducing the waveform occupies more system resources such as memory, as well as increasing the data transfer time between Radar Controller and the Radar Exciter. FIG. 46 shows a diagram view 4600 illustrating the waveform synthesis concept. In this example, a Waveform Library File (WLF) 4610 contains four entries; CPI 1, CPI 2, CPI 3 and CPI 4. Multiple waveforms are created in memory. Each waveform has unique properties. For the selected WOI (CPI 4), each pulse undergoes synthesis 4620 to produce Waveform Objects 4630 categorized by CPI waveforms 4640, each corresponding to waveform properties 4650. Due to the implementation complexity, several programming objects 4630 are created to contain the waveform properties 4640 and the appropriate digital improvement factor (IF) waveform that later will be loaded into the Radar Exciter.

Section XI—Correlation Analysis: The control processor 320 performs signal processing similar to a pulse Doppler radar. The major signal processing function used in the analysis was pulse compression, thereby performing a cross-correlation between the amplified signal and its reference. The cross-correlation is used for three reasons: being a known system identification tool, involves ubiquitous operation in practically all modern radars, and maximizes SNR.

Figure 47:
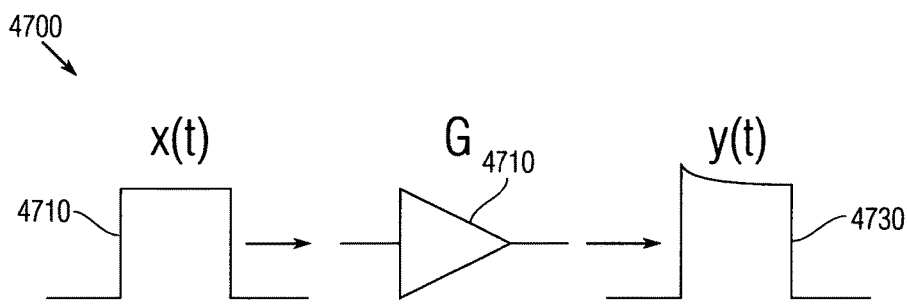
FIG. 47 is a signal diagram view of waveform amplification.

Data collection requires the digital sampling of the power amplifier's input and output. This process also requires the storage of information regarding the WOI and the sequence being fed to the amplifier. The stored data include information about the multifunction waveform sequence used during data capture, including its properties and others derived from the experiment implementation. The information collected must be sufficient to characterize the amplifier and repeat the test at a later time. The developed pre-distortion algorithm relies on knowing the operating conditions of the amplifier to calculate the pre-distortion coefficients. For every pulse in the WOI a sample of the input signal to the power amplifier must be collected. This is the reference used to establish changes in the amplifier's scalar gain and phase insertion. FIG. 47 illustrates a signal diagram view 4700 with an input signal x(t) 4710 being amplified and distorted by the amplifier 4720 resulting in the output signal y(t) 4730. A sample of the amplified output signal y(t) 4730 must also be collected. The amplifier has a transfer function described by G. For a stable input signal x(t) 4710, any changes in the amplifier's transfer function will be reflected at the output signal y(t) 4730.

As an example, the input signal x(t) 4710 and the output signal y(t) 4730 are RF signals, at a carrier frequency between 2.9 GHz and 3.4 GHz. The signal should be digitized and frequency translated into baseband complex signals (in-phase (I) and quadrature (Q) components), before processing. These signals are digitally represented by x[k] and y[k], were k in the index of the sampled data. The complex components can be written as:

$$A(t) = I\cos(\omega t) + jQ\sin(\omega t), \quad (11)$$

$$\phi(t) = \arctan\left(\frac{Q}{I}\right), \quad (12)$$

$$I = \frac{A(t)}{2}\cos\phi, \text{ and} \quad (13)$$

$$Q = \frac{A(t)}{2}\sin\phi, \quad (14)$$

where A(t) is amplitude and φ(t) is phase, t is time and ω is carrier frequency (removed during down-conversion).

An important signal processing function used in Pulse Doppler radars is pulse compression. It is accomplished by performing a cross-correlation between the received radar echo and a reference. Cross-correlation is ubiquitous in practically all modern radars. The cross-correlation maximizes the signal to noise ratio and is also used in a system identification technique known as the Wiener-Hopf equation. The Wiener-Hopf equation uses an autocorrelation matrix and cross correlation to estimate a system's transfer function. Its conditions include the assumption that the system is asymptotically stable. Thus, this technique is ideal to characterize the amplifier complex gain on a pulse-to-pulse basis. The complex gain of the amplifier is found by relating the digital representation of its output signal y[k] to its input signal x[k]. In modern radar systems, the reference signal is synthesized rather than sampled. This assumes the system clock-source is highly stable. Due to the instrument grade quality of the clock-sources available for this study, the experiment requires sampling both signals x[k] and y[k]. This mitigates clock-source instabilities that may otherwise disturb the results. A calibration process performed during the implementation of the experiment enables scaling both signals so that their power levels are known.

Pulsed Signals: The signals x[k] and y[k] are in the baseband I/Q domain, and are expressed as shown in eqns. (15) and (16):

$$x[k] = \begin{cases} A_x \exp(j\phi_x), & k = 0, 1, 2, \ldots N_S - 1 \\ 0, & \text{elsewhere} \end{cases}, \text{ and} \quad (15)$$

$$y[k] = \begin{cases} A_y \exp(j\phi_y), & k = 0, 1, 2, \ldots N_S - 1 \\ 0, & \text{elsewhere} \end{cases}, \quad (16)$$

where for signals x[k] and y[k] respectively, $A_x$ and $A_y$ are the pulse amplitude envelopes and $\phi_x$ and $\phi_y$ are the pulse phase envelopes, k is the index for the sampled data, $N_S$ is the number of data samples collected excluding times when the signal is not present. This ensures that the complex gain G of the amplifier 4720 is calculated when fed a valid signal.

$$G = \frac{A_y \exp(j\phi_y)}{A_x \exp(j\phi_x)} = \frac{A_y}{A_x}\exp\{j(\phi_y - \phi_x)\} \equiv \frac{A_y}{A_x}e^{j(\phi_y - \phi_x)}. \quad (17)$$

The gain can be separated into amplitude and phase portions, respectively expressed in decibels (dB) and degrees (°):

$$G_A = 20\log_{10}\left|\frac{A_y}{A_x}\right|, \text{ and} \quad (18)$$

$$G_\phi = \frac{180}{\pi}(\phi_y - \phi_x) \quad (19)$$

The sample autocorrection function is shown as:

$$r_{xx}(m) = \begin{cases} \frac{1}{N_S}\sum_{n=0}^{N_S-m-1} x[n+m]x^*[n], & m \geq 0 \\ r_{xx}^*(-m), & m < 0 \end{cases}, \quad (20)$$

where, $r_{xx}(m)$ is the autocorrelation of x[k], $N_S$ is number of samples, m and n are indices and the asterisk refers to a complex conjugate.

The amplitude and phase of the signal x[k] remain constant throughout the duration of the pulse. The phase component $\phi_x$ of the autocorrelation cancels out. The sample autocorrelation function can then be solved explicitly as shown in eqns. (21) and (22):

$$r_{xx}(m) = \begin{cases} A_x^2\left(1 - \dfrac{m}{N_S}\right), & m \geq 0 \\ A_x^2\left(1 + \dfrac{m}{N_S}\right), & m < 0 \end{cases} \text{ or} \quad (21)$$

$$r_{xx}(m) = A_x^2\left(1 - \dfrac{m}{N_S}\right), \quad -(N_S - 1) \leq m \leq (N_S - 1). \quad (22)$$

Similarly, the cross-correlation sample function can thus be expressed as:

$$r_{xy}(m) = \begin{cases} \dfrac{1}{N_S} \sum_{n=0}^{N_S - m - 1} x[n+m]y^*[n], & m \geq 0 \\ r_{xy}^*(-m), & m < 0 \end{cases}, \quad (23)$$

where the phase components $\phi_x$ and $\phi_y$ of the cross-correlation are maintained. The cross-correlation between signals x[k] and Y[k] is expressed in eqn. (24). The signal amplitude and phase are written explicitly into the sample cross-correlation function:

$$r_{xy}(m) = \begin{cases} \dfrac{1}{N_S} \sum_{n=0}^{N_S - m - 1} A_x \exp(j\phi_x) A_y \exp(j\phi_y) f(n, m), & m \geq 0 \\ r_{xy}^*(-m), & m < 0 \end{cases}, \quad (24)$$

where $f(n,m)$ is a unit step function that sets the limits where $r_{xy}(m)$ differs from zero. This function can be expressed as:

$$f(n,m) = (u[n+m] - u[n+m-N_S])(u[n] - u[n-N_S]). \quad (25)$$

After simplification, the result of the sample cross-correlation in the analyzer 470 is shown in eqn. (26):

$$r_{xy}(m) = \begin{cases} A_x A_y \exp\{j(\phi_x - \phi_y)\}\left(1 - \dfrac{m}{N_S}\right), & m \geq 0 \\ A_x A_y \exp\{-j(\phi_x - \phi_y)\}\left(1 + \dfrac{m}{N_S}\right), & m < 0 \end{cases}. \quad (26)$$

From the autocorrelation and cross-correlation, a Wiener-Hopf estimate of complex gain G can be determined Wiener-Hopf states that:

$$r_{xy}(m) = \sum_{k=0}^{S} g(k) r_{xx}(m - k), \quad (27)$$

where, $r_{xx}(m)$ is the autocorrelation of x[k], g(k) is the Finite Impulse Response (FIR) filter coefficients of a system and $r_{xy}(m)$ is the cross correlation of [k] and y[k]. Substituting the sample correlation function values into the Wiener-Hoof eqn. (27) for 0, 1, 2, . . . , gives the relations:

$$r_{xy}(0) = g(0) r_{xx}(0) + g(1) r_{xx}(-1) + g(2) r_{xx}(-2) + \ldots + g(S) r_{xx}(-S) \quad (28)$$
$$r_{xy}(0) = g(0) r_{xx}(1) + g(1) r_{xx}(0) + g(2) r_{xx}(-1) + \ldots + g(S) r_{xx}(1 - S)$$
$$\vdots$$
$$r_{xy}(A) = g(0) r_{xx}(S) + g(S) r_{xx}(S - 1) + g(2) r_{xx}(S - 2) + \ldots + g(S) r_{xx}(0)$$
$$r_{xy}(0) = g(0) r_{xx}(0) + g(1) r_{xx}(-1) + g(2) r_{xx}(-2) + \ldots + g(S) r_{xx}(-S),$$
$$r_{xy}(1) = g(0) r_{xx}(1) + g(1) r_{xx}(0) + g(2) r_{xx}(-1) + \ldots + g(S) r_{xx}(1 - S)$$
$$r_{xy}(2) = g(0) r_{xx}(2) + g(1) r_{xx}(1) + g(2) r_{xx}(0) + \ldots + g(S) r_{xx}(2 - S)$$
$$\vdots$$
$$r_{xy}(S) = g(0) r_{xx}(S) + g(S) r_{xx}(S - 1) + g(2) r_{xx}(S - 2) + \ldots + g(S) r_{xx}(0)$$

or in matrix form:

$$r_{xy} = \begin{bmatrix} r_{xy}(0) \\ r_{xy}(1) \\ r_{xy}(2) \\ \vdots \\ r_{xy}(S) \end{bmatrix} = R_{xx} g \quad (29)$$

$$= \begin{bmatrix} r_{xx}(0) & r_{xx}(-1) & r_{xx}(-2) & \ldots & r_{xx}(-S) \\ r_{xx}(1) & r_{xx}(0) & r_{xx}(1) & \ldots & r_{xx}(1-S) \\ r_{xx}(2) & r_{xx}(1) & r_{xx}(0) & \ldots & r_{xx}(2-S) \\ \vdots & \vdots & \vdots & \ddots & \vdots \\ r_{xx}(S) & r_{xx}(S-1) & r_{xx}(S-2) & \ldots & r_{xx}(0) \end{bmatrix} \begin{bmatrix} g(0) \\ g(1) \\ g(2) \\ \vdots \\ g(S) \end{bmatrix},$$

where $R_{xx}$ is the autocorrelation matrix. The elements of the filter g(0), g(1), . . . g(S) can be solved by matrix inversion:

$$g = R_{xx}^{-1} r_{xy}. \quad (30)$$

For the sampled signals x[k] and y[k], the amplifier acts as an all pass filter. The amplifier will distort the shape of the pulse, meaning that the complex gain changes slightly thorough the pulse progression (intrapulse distortion). However, the interest in this investigation is to characterize the difference between consecutive pulses (interpulse distortion). Therefore, the amplifier's transfer function is treated as a single complex gain coefficient as shown in eqn. (17). This means that the size of the filter is only one tap:

$$g = g(0). \quad (31)$$

The autocorrelation matrix is then simplified to:

$$R_{xx} = r_{xx}(0). \quad (32)$$

The matrix system is then reduced to:

$$g(0) = \frac{r_{xy}(0)}{r_{xx}(0)}. \quad (33)$$

The results from eqn. (33) state that only $r_{xx}(0)$ and $r_x(0)$ are needed to calculate the mean complex gain of the amplifier over a pulse. Thus, the sample autocorrelation is reduced to eqn. (34), and the sample cross-correlation is reduced to eqn. (35):

$$r_{xx}(0) = A_x^2, \quad (34)$$

and $$r_{xy}(0) = A_x A_y \exp\{j(\phi_x - \phi_y)\}. \quad (35)$$

The filter coefficient g(0) is calculated to be:

$$g(0) = \frac{A_y}{A_x}\exp\{j(\phi_x - \phi_y)\}. \quad (36)$$

Recalling the amplifier complex gain in eqn. (17), the amplifier complex gain G is the complex conjugate of g(0) as g*(0):

$$G = \frac{A_y}{A_x}\exp\{j(\phi_y - \phi_x)\} = g^*(0), \quad (37)$$

$$\text{written as: } G = \frac{r_{xy}^*(0)}{r_{xx}(0)}. \quad (38)$$

The respective amplitude and phase can be expressed as:

$$G_A = 20\log_{10}\left|\frac{r_{xy}^*(0)}{r_{xx}(0)}\right|, \text{ and} \quad (39)$$

$$G_\phi = -\frac{180}{\pi}arg\{r_{xy}(0)\}. \quad (40)$$

The result from the cross-correlation method is the conjugate of a single filter coefficient g*(0) for each pulse in the WOI. The complex number g*(0) contains information about the amplifier's average scalar gain and insertion phase during a processed pulse. The amplifier behavior is then expressed as the change in scalar gain and insertion phase over the WOI duration. Each computed g*(0) must be indexed to a pulse within in the WOI. Thus, for a WOI that contains N pulses, the complex gain g*(0) is indexed as follows:

$$G_{CC}(n) = \frac{r_{xy}^*(0, n)}{r_{xx}(0, n)}, \quad (41)$$

where $G_{CC}(n)$ in the indexed complex gain g*(0) of the $n^{th}$ pulse in a the WOI. $r_{xx}(0,n)$ is the autocorrelation of the $n^{th}$ pulse in the WOI, and $r_{xy}^*(0,n)$ is the cross-correlation of the $n^{th}$ pulse.

With proper calibration and scaling, g*(0) results in the actual amplifier gain and insertion phase. The actual value of g*(0) changes depending on the frequency of operation and device flange temperature, making visualization of the amplifier behavior difficult. This is overcome by normalizing the gain and applying a phase offset to the insertion phase. The first pulse in the $G_{CC}(n)$ response is used as reference. The normalized indexed amplitude is defined by eqn. (42), while the zeroed insertion phase is defined by eqn. (43):

$$A[n] = \left|\frac{G_{CC}(n)}{G_{CC}(1)}\right|, \text{ and} \quad (42)$$

$$\phi[n] = arg\{G_{CC}(n)\} - arg\{G_{CC}(1)\}. \quad (43)$$

Both the normalized gain A[n] and zeroed insertion phase φ[n] can show trends across the duration of the WOI. The interpretation of A[n] can have various equivalent meanings. By definition A[n] is interpreted as a change in voltage gain. Because the input signal has constant envelope from pulse to pulse, A[n] can also be interpreted as a change in output power. The zeroed insertion phase φ[n], can only be interpreted as the change in the insertion phase. The insertion phase can be seen as a stretching effect in a transmission line.

Section XII—GaN Integration: The incorporation of GaN technology in future radar systems will present unique challenges. One of these challenges was identified as interpulse instability, a major factor for Pulse Doppler and MTI radar performance. The characterized behavior showed changes in the device's complex gain over a CPI length. The phase transient was determined to be two orders of magnitude worse than the amplitude transient with regards to performance degradation. Similar behavior, in terms of duration and magnitude, was reported in for two different GaN Class AB PA designs. The behavioral model 2010 was developed to replicate the amplifier's behavior, with a high degree of precision, using a two time-constant Foster network topology to describe the amplitude transient, and three time-constant Foster network topology for the phase transient. The behavioral model 2010 was validated by using the inverse 2745 of the predicted amplitude 2725 and phase transient 2735 along with compensation for AM/AM 2730 and AM/PM 2730 conversion to digitally pre-distort individual pulses in a CPI. The residual transient was significantly smaller than the original transient, thus increasing radar system stability. This was verified by using the MTI improvement factor and RMS P2P stability metrics. The digital pre-distortion significantly improves the system stability by at least 10 dB, reducing the time required for the system to achieve the desired stability.

Implementing the digital pre-distortion technique may require radar system architecture modifications or redesigns. In particular, the radar exciter must have enough flexibility to apply amplitude and phase corrections to each individual pulse in a CPI. This concept contradicts the standard practices followed by the radar community, which require identical pulses within a CPI. Some aspects of interpulse instability deserve further study. The transient effects could be mitigated by decreasing the temperature difference between layers, effectively shifting the time constants to values that not affect the CPI. This approach is linked to properties such as thermal resistance and thermal capacitance. One possible solution would be to decrease the thickness of the heat spreading flange and to replace the material with one of higher thermal conductivity. Another area that could be assessed is the performance degradation that these interpulse instabilities have on pulse Doppler signal processing with modulated pulses and pulse repetition frequency (PRF) staggered pulses in MTI radars.

The exemplary digital pre-distortion algorithm and methodology are presented to correct instabilities induced by radar power amplifiers during typical radar operations. These instabilities are generated when the power amplifiers are excited by dissimilar radar waveforms. The exemplary digital pre-distortion algorithm effectively cancels the instabilities in respect to the radar's coherent master oscillator. Exemplary embodiments provide techniques regarding radar's transmitter power amplifier and exciter (waveform generator). The exemplary processes employ a priori information from the radar scheduler to compute correction coefficients. A complex coefficient (in amplitude and phase) is generated for each pulse in a waveform. The coefficients are provided to the radar's digital exciter for synthesis. These effectively counteract the interpulse instability introduced by the amplifier. This technique increases the coherency of the radar's transmitter waveform and enables the radar system to achieve desired system stability in a reduced time interval over conventional operations. There are two important elements to the exemplary embodiments. The first is the process to characterize the amplifier in order to generate the associated parameters. The second involves using the model to generate a correction coefficient for the digital prediction.

Element-1—Characterization of Power Amplifier involves the following steps:

Step (1) Find Operating Point: For each frequency of operation, find a suitable operating point of the amplifier. This is usually accomplished in laboratory testing or in final assembly testing of radar transmit/receive (T/R) module. Store values in a lookup table, if calibration tables are not available, for later use.

Step (2) Measure Modulation Conversion Ratio: For each operating point found in step (1), perform an AM/AM and AM/PM conversion measurement (where AM represents amplitude modulation and PM represents phase modulation). This is usually done in laboratory testing or in final assembly testing of radar T/R module. Store values in lookup table or find a suitable polynomial fit, store for later use. These values are only needed if AM/AM conversion compensation is performed as part of the pre-distortion implementation, alternatively skip step (2).

Step (3) Generate Pulse Width versus Duty Cycle Table: Laboratory testing must be performed as part of the system design to evaluate which waveform transitions cause significant system instability to warrant compensation. From designed waveforms library or hardware limitations, create a subset of possible pulse widths and duty cycles. Variable delays in between waveforms can, such as when passive surveillance or other EMCON evens are happening can also be included.

Step (4) Generate Waveform Sequence Pair: If the number of waveforms found in step (3) is N. Then for each $n^{th}$ entry generate a sequence where the $n^{th}$ entry is preceded by a single $m^{th}$ entry, where m=1, 2, 3, . . . N. Entries in which n=m are omitted. The waveform sequence using the $n^{th}$ pulse is called Waveform of Interest (WoI), whereas the preceding waveform using the $m^{th}$ entry is called Preceding Waveform (PWav). The resulting Waveform Sequence Pair (WSP) table 190 has $N^2-N$ entries. The WSP table 190 can be used during the device characterization and later during radar system operations as part of a test to determine whether a multifunction sequence causes interpulse instabilities.

Step (5) WoI Capture: For the WSP 110 found in step (4), the entire WoI must be captured. FIG. 1 shows the block diagram view 100 of the power amplifier characterization process. The WSP 110 is loaded 120 to the digital exciter. The digital exciter synthesizes the waveforms 130. A reference signal 140 and a sample of the amplified signal are collected 150.

Step (6) WoI Data Processing: For each pulse in the WoI perform a cross correlation 160 over the duration of the transmitted pulse. Search for the peak cross correlation response and store the resulting complex value for later use 170. There are k values, where k is the number of pulses in WoI. Steps (5) and (6) are repeated until exhaustion of the WSP list 180.

Step (7) Model Parameter Extraction (optional): As an alternative to the model approach in step (7), one can use the coefficients found and stored in step (6) for the pre-distortion. Using the response found in step (6), one can find the model parameters for amplitude and phase transient.

As an example, the interpulse transients 170 can be represented by a cascaded Foster network, numerically approximated by solving the following exponential relations:

$$A_m[n] = -P_{1A}\exp\left(\frac{-(n-1)}{PRF}\frac{1}{t_{1A}}\right) - P_{2A}\exp\left(\frac{-(n-1)}{PRF}\frac{1}{t_{2A}}\right) + c_A \quad (44)$$

$$\phi_m[n] = -P_{1\phi}\exp\left(\frac{-(n-1)}{PRF}\frac{1}{t_{1\phi}}\right) - \\ P_{2\phi}\exp\left(\frac{-(n-1)}{PRF}\frac{1}{t_{2\phi}}\right) - P_{3\phi}\exp\left(\frac{-(n-1)}{PRF}\frac{1}{t_{3\phi}}\right) + c_\phi \quad (45)$$

where $A_m[n]$ is the modeled transient amplitude in volts and $\phi_m[n]$ phase in radians per seconds, for the $n^{th}$ pulse in the CPI, with discrete pulse indices n=1, 2, 3, . . . N. The time constants τ are on the order of dozens of micro-seconds (µs) to milliseconds (ms). Variables $P_{xy}$ and c are respective functions of the preceding waveform's pulse width and duty cycle. The model is at the level of baseband envelope domain post pulse compression. The model parameters are stored in a lookup table for subsequent operation.

Element-2: Implementation Digital Pre-distortion: This element relies on the fact that modem radar's waveforms are scheduled several milliseconds in advance. All the necessary information to execute the waveform is contained in the Radar Event Message (REM). This REM is generated by the radar control processor and interpreted by various other radar sub-systems.

Item (1) Evaluating Future Waveforms: FIG. 2 shows the flowchart view 200 of the digital pre-distortion algorithm. After an REM is generated 210, a logic test is needed to evaluate whether to pre-distort a particular waveform sequence 220. The WSP table 190 generated in the amplifier characterization algorithm is the basis for the decision. Other factor includes expected large clutter returns.

Item (2) Load Model Parameters: Using the WSP table 190 indexing, retrieve model parameters from lookup table 230. Alternatively to the model parameter coefficient from element-1 step (7), the actual peak cross correlation response found on element-1 step (6) can be retrieved and made available in 230.

Item (3) Invert Model Coefficients: Evaluate the parameters from step (2) to obtain amplitude and phase coefficients 240. The model imitates the behavior of the amplifier for the specified conditions. The inverse is employed to implement the digital pre-distortion. The model provides amplitude $A_m[n]$ in volts and phase $\phi_m[n]$ in radians per seconds, where n is the pulse index in the CPI. Alternatively; amplitude and phase can be retrieved from the peak cross correlation response found on Element-1 step (6). The pre-distortion coefficients are calculated following the procedure discussed block diagram 2700:

Item (4) Modulation Conversion Compensation: Decide if AM/AM and AM/PM conversion compensation is needed 250. If no compensation is required, then force $A_m[n]$=1 and skip to step (5). If compensation is needed, retrieve the modulation conversion coefficients 260 and generate correction polynomials 270 for amplitude and phase. Adjust the pre-distortion. coefficients 280 according to standard practice for AM/AM and AM/PM conversion. The AM/AM and AM/PM conversion is significant in highly compressed Power Amplifiers. In one option, the operator skips this step by forcing $A_m[n]=1$. The tradeoff between compensating for the AM/AM and AM/PM conversion is as follows: tradeoff (1) If choose to skip by forcing $A_m[n]=$, only phase will be corrected leaving the amplitude transient to contest, or tradeoff (2) compensating for AM/AM conversion can complicate the phase correction due to significant AM/PM conversion.

Item (5) Apply Pre-distortion Coefficients: Attach the pre-distortion coefficients to the REM 290. This is accomplished after updating the REM with pre-distortion coefficients 280.

Item (6) Execute REM: The REM waveform is synthesized by the radar digital exciter. Each pulse in the waveform has now a unique complex gain. The interaction between the unique pulses and the power amplifier are such that the resulting transmitted pulse is coherent with respect to the radar's master oscillator.

Example, Application: FIG. 8B shows a tabular view 850 as Table II shows the waveform specification used in this example. The CPI 1 530 and CPI 2 630 have significantly different pulse width and duty cycle. They are arranged as WSP 110 and feed to the power amplifier in perpetuity. CPI 1 530 is WoI, and CPI 2 630 is a PWav. Each synthesized pulse inside a CPI is identical to each other. The resulting amplitude and phase transient analyses are shown in FIGS. 16 and 17. The CPI 1 waveform WoI is preceded by a significantly different (and previous) waveform (CPI 2 630) PWav. The duty cycle differences suggest that the power amplifier is transitioning from a cooler state (lower channel temperature) after transmitting CPI 2 630 to a warmer state (higher channel temperate) after transmitting CPI 1 530, (Alternatively, the duty cycle differences can transition from a cooler state from inert status CPI 4 3340 to a warmer state CPI 3 3330. The gain decreases as the CPI progresses across the 32 pulses, a phase transient of several degrees can also be observed. The amplitude and phase transients can be induced by a cooler waveform (CPI 2 630) that precedes the calibration waveform (CPI 1 530).

MTI instability limitation is used to calculate the clutter improvement limitations due to the amplifier transient. This example uses this metric for interpulse instability. The limit for improvement factor due to pulse amplitude change is given by eqn. (46), and for the transmitter phase shift is given by eqn. (47):

$$I_A = 20\log_{10}\left|\frac{A}{\Delta A}\right|, \text{ and} \tag{46}$$

$$I_\phi = 20\log_{10}\left|\frac{A}{\Delta\phi}\right|, \tag{47}$$

where I is the limit in the improvement factor given in dB as from eqn. (4), A is the pulse amplitude in volts and $\Delta A$ is the interpulse amplitude change and $\Delta\phi$ is the interpulse phase change in radians per second. The two instabilities are combined into a single relation:

$$R_C[n] = -20\log_{10}|A_m[n]e^{j\phi_m[n]} - A_m[n-1]e^{j\phi_m[n-1]}|, \tag{48}$$

where $R_C[n]$ is the improvement factor (or cancellation ratio) of two adjacent pulses, n is the index of the pulse within a CPI, $A_m[n]$ is the amplitude transient in volts and $\phi_m[n]$ is the phase transients in radians per second. FIG. 30 shows the MTI improvement factor for the instability in plot view 3000, before and after digital pre-distortion, including improvement factor limitations due to interpulse instabilities. The significant increase in MTI improvement factor can be observed from pre-distortion. This represents a significant improvement over the instabilities produced by the original phase transient.

A simulation was conducted to illustrate the relationship between MTI Improvement Factor and SNR. For a noiseless process, the signal $A[n]\exp\{j\phi[n]\}$ has an amplitude $A[n]$ equal to unity and a phase $\phi[n]$ equal to zero. The simulation was limited to changing the SNR of A[n] as follows:

$$A[n]=1+\tilde{N}[n] \tag{49}$$

where $\tilde{N}$ is a complex random variable with a Gaussian probability function (circularly symmetric with complex normal) having variance of $$\sigma^2 = 10^{-SNR/10} \tag{50}$$

and zero mean. The first two operations within eqn. (4) take the absolute of the difference between two adjacent signal values. The probability distribution function is now a Rayleigh distribution, with variance equal to:

$$\sigma^2 = \frac{4-\pi}{2} \tag{51}$$

and mean equal to:

$$\sigma = \sqrt{\frac{\pi}{2}} \tag{52}$$

The resulting MTI Improvement Factor has a logarithmic Rayleigh distribution. Assuming no system noise or instabilities, the ideal value of:

$$G_{CC}(n) \to 1, \forall n \tag{53}$$

as a constant value for all indices n, establishing the ideal Improvement Factor as infinite. However because digitized signals are corrupted by system noise, the MTI Improvement Factor is practically limited. For a given SNR, the MTI Improvement Factor adopts a mean value of:

$$I[n] = -20\log_{10}\left\{\sigma\sqrt{\frac{\pi}{2}}\right\} = SNR - 2 \text{ dB}. \tag{54}$$

Figure 48:
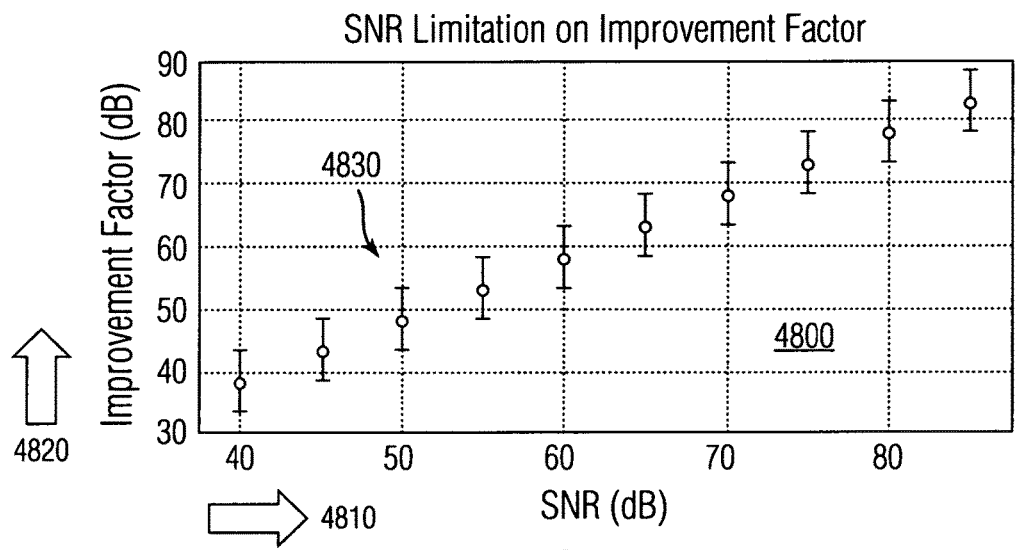
FIG. 48 is a graphical view of SNR limitation on improvement.
Figure 49:
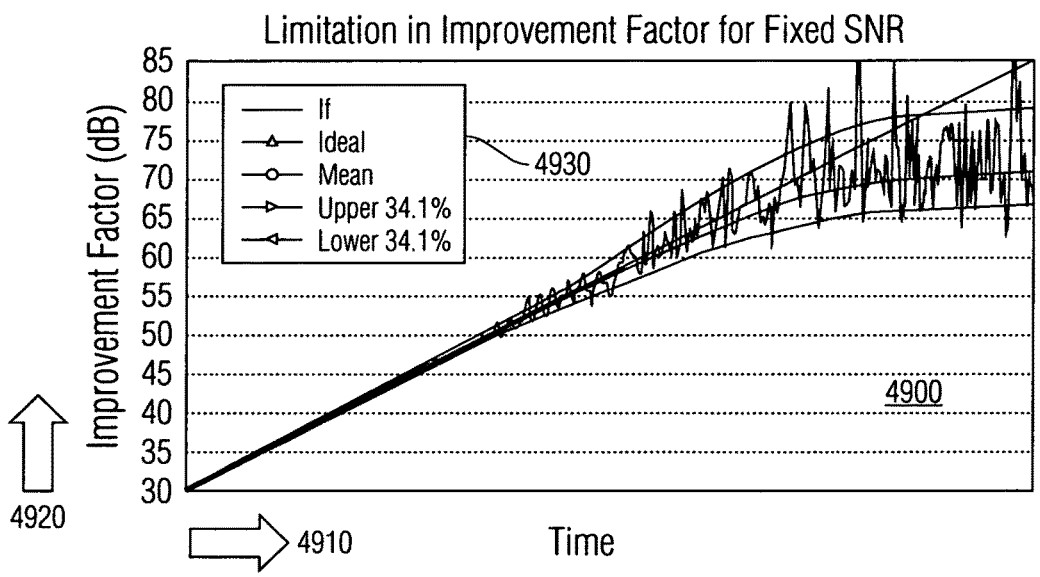
FIG. 49 is a graphical view of improvement factor limitation for fixed SNR.

FIG. 48 shows a graphical view 4800 of SNR limitation on MTI improvement factor, with confidence level of 68.2%. The abscissa 4810 denotes signal-to-noise ratio (SNR) in decibels (dB), while the ordinate 4820 denotes improvement factor in decibels (dB). Plotted values 4830 show proportional increase in improvement, together with a corresponding error bar for the values of +5.4 dB above and −4.4 dB below the mean. FIG. 49 shows a graphical view 4900 of improvement factor limitation for a fixed SNR. The abscissa 4910 denotes time in microseconds (μs), while the ordinate 4920 denotes improvement factor in decibels (dB). A legend 4930 identifies lines corresponding to displayed values. These include solid line for simulated improvement factor for a noisy signal, upright solid triangle for ideal, solid circle for mean, right solid triangle for upper 34.1% and left solid triangle for lower 34.1%.

In this example, the MTI Improvement Factor increases over time, but plateaus, apparently influenced by noise. The mean value is limited to 71 dB as predicted by eqn. (54). The right and left triangles show the boundaries of MTI Improvement Factor, where 68.2% of the values for the MTI Improvement Factor lie around the mean. Low values of Improvement Factor have a small deviation from the ideal value. As the Improvement Factor increases the deviation increases as well. For example, at a time where the ideal Improvement Factor is 30 dB, the measured value is 30 dB±0.3 dB. At a time where the ideal Improvement Factor is 53 dB, the measured value is 53 dB±1.0 dB. The graphical view 4900 clearly shows that the accuracy and precision of an MTI Improvement Factor measurement is impacted by the SNR. A valid MTI Improvement Factor measurement requires an SNR several decibels above the expected Improvement Factor. If an Improvement Factor measurement requires a precision of ±1.0 dB or better, then the SNR must be at least 20 dB higher than the intended target Improvement Factor.

Exemplary embodiments are relevant to future radar systems that employ solid state power amplifiers. Programs that can adopt exemplary embodiments include G/ATOR, AMDR and flexible digital array radar (FlexDAR); in short, future Navy surface high-power aperture radar systems. This can also be retro-fitted to radar systems. Future radar architecture design offers the potential for increased dynamic range when compared to more conventional systems due to the use of a multiple distributed receiver/exciter. This enables higher clutter cancellation ratios, improves MTI and pulse Doppler processing. A primary objective is to detect more challenging targets that are obscured by clutter. This demands improved system stability. The disclosed algorithm-based method represents an excellent manner to achieve this.

Exemplary embodiments provide an algorithm that mitigates the interpulse instabilities generated by radar's power amplifiers when excited with multifunction radar waveforms. The concept and development of the exemplary algorithm originated from research and the NISE origin of memory effect time-constants on GaN high-power amplifier (HPA) project. Acknowledgements are provided regarding substantial material and facilities support from Naval Surface Warfare Center-Dahlgren Division. Other programs that have collaborated with this effort via loaning devices and instrumentation are the digital array radar (DAR), the affordable common radar architecture (ACRA) and the network cooperative radar (NCR).

Conventionally, the only method practiced to mitigate these instabilities is adding extra pulses as fill pulses until the transients diminishes. This reduces the effect on the radar's stability thus maintaining sensitivity. However, this approach is costly. The received echo signals due to these extra pulses are discarded before processing, because they lack the required stability. The RF energy is wasted reducing the overall efficiency of the system. The time expended in the transmission of the extra pulses cannot be used for the purposes of search or track legitimate targets. This problem is expected to become more prevalent with the use of more dynamic multifunction waveforms. The fill pulse technique can strain the scheduler as more radar resources (time and energy) will be used to mitigate the transients.

Exemplary embodiments provide various advantages over the current state of the art, mainly in the form of more efficient and faster use of radar resources. First, the need to add fill pulses for the sake of interpulse instability is significantly mitigated due to the resulting transmitted pulse being coherent with respect to the radar's master oscillator. Secondly, the embodiments increase the radar's power efficiency, so there will be less RF energy wasted. Third, considerable time savings can be achieved by obviating cool-down times. This additional time available to the radar's scheduler increases search rate. All of these advantages are possible by pre-distorting each individual pulse within a CPI having a unique complex coefficient. The coherent interaction between pulses and the master oscillator enables the radar system to achieve desired system stability more quickly than conventionally possible.

Alternatives to the described embodiments include: (1) Adding extra pulses as fill pulses until the transients diminishes, (explained above). (2) Limit the waveform selection to prevent the transients from being a problem. This can be accomplished at least in two ways: (a) the waveforms are selected so that instabilities only occur occasionally, at which point the fill pulse technique can be used, or (b) the progression between scheduled waveform is such that the instabilities are not significant enough to warrant any corrections. (3) Correct for transient at the receiver. If the transient effect is known or measured, the inverse of the coefficient can be applied to the received echo. This improves instability for unambiguous returns, but lacks effectiveness in negating the instability from ambiguous returns.

The exemplary model has been used to develop a digital pre-distortion technique that successfully mitigates the effect of the transients. The Moving Target Indicator (MTI) improvement factor is used as a metric to assess the effect of the transients on radar system performance and to test the effectiveness of the exemplary digital pre-distortion concept. Data are shown for both modeled and measured cases with excellent agreement between the two cases. Various embodiments describe an exemplary behavioral model and parameter extraction technique that can be used to model electrical and electrothermal memory effects in multifunction radar systems. Self-heating memory effect is identified as the primary mechanism that causes the observed transient. A thermal model of the GaN MMIC stack-up configuration 710 is used to establish a relationship between the observed transient and a change in channel temperature and the layers' time constant.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A method for correcting thermally-induced radar signal transient variation induced by power amplification in a pulse radar transmitter, said method comprising:
   establishing a first plurality of characteristics of a reference pulse sequence having a reference digital pulse repeatable over said reference pulse sequence;
   establishing a second plurality of characteristics of a transmit pulse sequence having a plurality of transmit digital pulses;
   comparing said first and second pluralities of characteristics to determine a sequence difference;
   providing pre-distortion coefficients for said plurality of transmit digital pulses corresponding to the signal transient variation in response to said sequence difference, said coefficients altering complex gain; and
   applying said coefficients to said plurality of transmit digital pulses prior to the power amplification in the pulse radar transmitter.

2. The method according to claim 1, wherein providing said coefficients includes searching a waveform library.

3. The method according to claim 1, wherein said first and second pluralities of characteristics include waveform name, pulse modulation, modulation bandwidth, pulse width, pulse duty cycle and number of pulses.

4. The method according to claim 1, wherein said pre-distortion coefficients include modulation conversion correction.

5. The method according to claim 4, wherein said modulation correction includes at least one of amplitude modulation-to-amplitude modulation conversion and amplitude modulation-to-phase modulation conversion.

6. The method according to claim 4, wherein said modulation correction is approximated by a second order polynomial.

7. The method according to claim 1, wherein said pre-distortion coefficients provide phase-only pre-distortion for said complex gain.

8. The method according to claim 1, wherein said reference and transmit pulse sequences are scheduled by respective first and second radar event messages.

9. The method according to claim 1, wherein comparing said first and second pulse pluralities of characteristics further includes:
  synthesizing a waveform;
  producing reference and sample signals from said waveform, said reference signal representing said reference digital pulse, and said sample signal representing a transmit digital pulse among said plurality of transmit digital pulses;
  amplifying said sample signal by said complex gain to produce an amplified signal;
  cross-correlating said reference and amplified signals to produce a difference signal for each digital pulse in said second pulse sequence;
  determining peak cross-correlation and corresponding time for said difference signal; and
  producing said pre-distortion coefficients for said waveform.

10. The method according to claim 9, further including storing said pre-distortion coefficients in a waveform library for comparison searches.

11. The method according to claim 9, wherein producing said signals further includes digitizing said reference signal as a digital reference signal and said sample as a digital sample signal.

12. The method according to claim 11, wherein said digitizing operation includes conversion to in-phase and quadrature form.

13. The method according to claim 1, wherein said complex gain denotes mean amplitude and mean phase.

* * * * *